United States Patent
Cho et al.

(10) Patent No.: US 9,703,368 B2
(45) Date of Patent: Jul. 11, 2017

(54) PROXIMITY SENSOR AND CONTROL METHOD THEREOF

(71) Applicant: LG ELECTRONICS INC., Seoul (KR)

(72) Inventors: Youngjun Cho, Seoul (KR); Sunuk Kim, Seoul (KR); Munchae Joung, Seoul (KR)

(73) Assignee: LG ELECTRONICS INC., Seoul (KR)

(*) Notice: Subject to any disclaimer, the term of this patent is extended or adjusted under 35 U.S.C. 154(b) by 36 days.

(21) Appl. No.: 14/812,616

(22) Filed: Jul. 29, 2015

(65) Prior Publication Data

US 2016/0061588 A1   Mar. 3, 2016

Related U.S. Application Data

(60) Provisional application No. 62/042,996, filed on Aug. 28, 2014.

(30) Foreign Application Priority Data

Oct. 1, 2014   (KR) .................... 10-2014-0132553

(51) Int. Cl.
*G01B 11/14*   (2006.01)
*G06F 3/00*   (2006.01)
(Continued)

(52) U.S. Cl.
CPC ............. *G06F 3/00* (2013.01); *G04G 21/00* (2013.01); *G06F 1/1626* (2013.01);
(Continued)

(58) Field of Classification Search
CPC   G07C 9/00563; G07C 9/00658; G01B 11/14; H04M 2250/12; G06F 3/00
(Continued)

(56) References Cited

U.S. PATENT DOCUMENTS 7,486,386 B1 *  2/2009  Holcombe ............... G01C 3/08
                                                   356/4.01
8,274,037 B2 *  9/2012  Ritter ......................... G01J 1/46
                                                   250/214 A (Continued)

FOREIGN PATENT DOCUMENTS

EP       2 204 640 A1    7/2010
JP       2010-199706 A   9/2010
(Continued)

OTHER PUBLICATIONS

Korean Search Report dated May 19, 2015 for Korean Application No. PCT/KR2014/009389, 15 Pages.

*Primary Examiner* — Sang Nguyen
(74) *Attorney, Agent, or Firm* — Fish & Richardson P.C.

(57) ABSTRACT

The present disclosure provides a proximity sensor including a light-emitting part that is configured to emit first light of a specific wavelength band, a light-receiving part that is configured to receive the first light and second light, the second light belonging to a different wavelength band from the first light, and a controller that is configured to recognize a proximate object based on the first light reflected by the proximate object, wherein the controller changes a light-reception range of the light-receiving part based on the second light.

15 Claims, 17 Drawing Sheets

(51) Int. Cl.
  *H04M 1/725* (2006.01)
  *G04G 21/00* (2010.01)
  *G06F 1/16* (2006.01)
  *H03K 17/94* (2006.01)
(52) U.S. Cl.
  CPC ......... *G06F 1/1684* (2013.01); *H03K 17/941* (2013.01); *H04M 1/7253* (2013.01); *H03K 2217/94104* (2013.01); *H03K 2217/94111* (2013.01); *H03K 2217/94116* (2013.01); *H04M 2250/12* (2013.01)
(58) Field of Classification Search
  USPC ............ 250/221, 459.1, 458.1, 252.1, 341.8, 250/214 AL, 241 B; 345/102, 98
  See application file for complete search history.

(56) References Cited

U.S. PATENT DOCUMENTS

| | | | |
|---|---|---|---|
| 8,450,679 B2 | 5/2013 | Yun | |
| 8,826,188 B2 | 9/2014 | Sheynblat | |
| 8,829,414 B2* | 9/2014 | Fadell | G01J 1/4204 250/214 AL |
| 8,981,302 B2* | 3/2015 | Yang | G06F 1/3231 250/338.1 |
| 2008/0165116 A1* | 7/2008 | Herz | G09G 3/3406 345/102 |
| 2008/0167834 A1* | 7/2008 | Herz | G06F 1/3203 702/150 |
| 2009/0283699 A1* | 11/2009 | Baltz | G01N 21/6408 250/459.1 |
| 2010/0171027 A1 | 7/2010 | Yun | |
| 2013/0049641 A1 | 2/2013 | Sheynblat | |
| 2014/0066049 A1* | 3/2014 | Cho | B60W 50/085 455/420 |
| 2014/0131560 A1* | 5/2014 | Chen | G01S 7/4811 250/221 |
| 2014/0131576 A1 | 5/2014 | Park | |
| 2015/0332532 A1* | 11/2015 | Lee | G07C 9/00563 340/5.72 |

FOREIGN PATENT DOCUMENTS

| | | |
|---|---|---|
| KR | 20-0191818 Y1 | 8/2000 |
| KR | 10-2010-0081052 A | 7/2010 |
| KR | 10-2014-0056359 A | 5/2014 |
| KR | 10-1402838 B1 | 6/2014 |
| WO | WO 2013/032635 A1 | 3/2013 |

\* cited by examiner

PRIOR ART FIG. 1
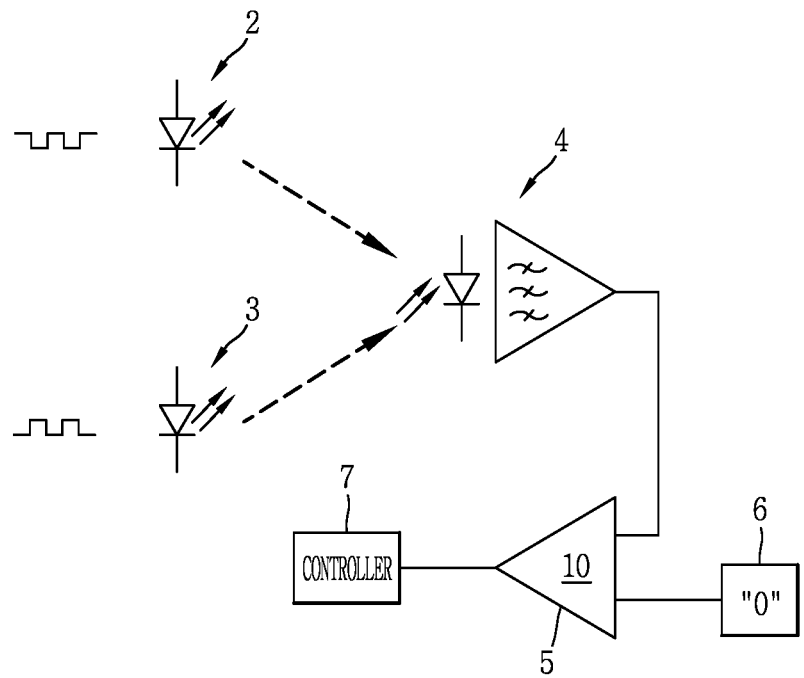
FIG. 2
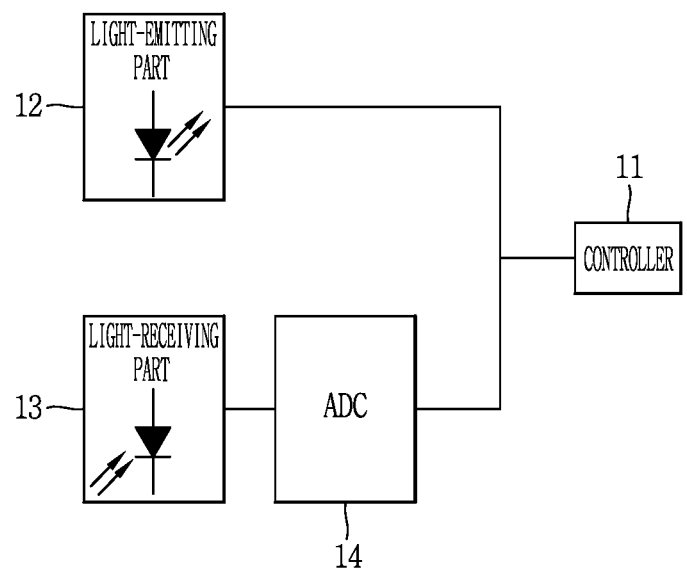

FIG. 3A
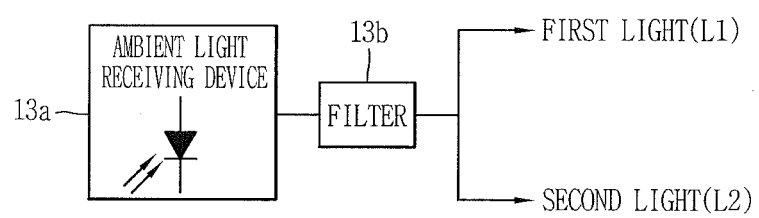
FIG. 3B
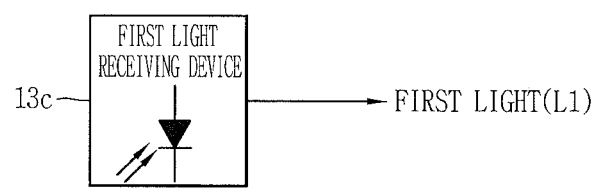
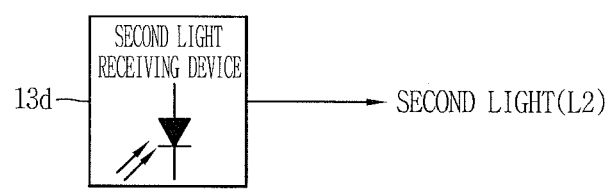

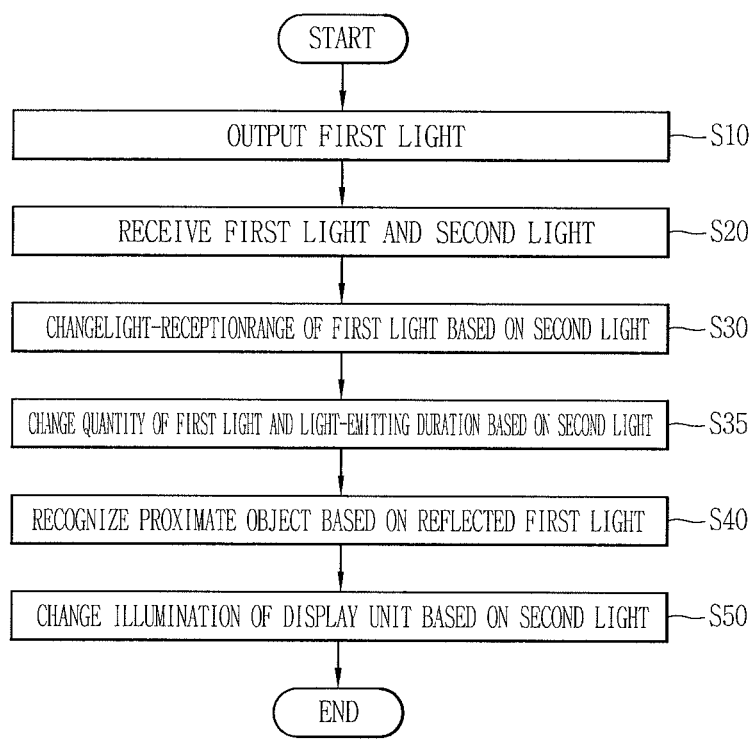

PROXIMITY SENSOR AND CONTROL METHOD THEREOF

CROSS-REFERENCE TO RELATED APPLICATION

Pursuant to 35 U.S.C. §119(a), this application claims the benefit of earlier filing date and right of priority to U.S. Provisional Application No. 62/042,996, filed on Aug. 28, 2014, and Korean Application No. 10-2014-0132553, filed on Oct. 1, 2014, the contents of which are incorporated by reference herein in its entirety.

BACKGROUND OF THE DISCLOSURE

1. Field of the Disclosure

This specification relates to a proximity sensor and a control method thereof, and more particularly, a proximity sensor, capable of avoiding an erroneous recognition of a proximate object caused due to external light, and a control method thereof.

2. Background of the Disclosure

In general, a proximity sensor is functioning as a user input device which recognizes an object moving close thereto. Even without a physical contact with a user's body, the proximity sensor may sense a size of a proximate object, a position of a proximate object, a distance from a proximate distance, and the like.

For example, the proximity sensor is provided at a position adjacent to a display unit of a mobile terminal so as to recognize an object located near itself. The mobile terminal may then process corresponding data and output visual information corresponding to the processed data on the display unit.

Meanwhile, the proximity sensor is also used as an input device along with a touch sensor, which senses pressure applied to a specific position in response to a direct contact with an object or changes of capacitance generated at the specific position.

The proximity sensor may be implemented into various types, such as a transmissive type photoelectric sensor, a direct reflective type photoelectric sensor, a mirror reflective type photoelectric sensor, a high-frequency oscillation proximity sensor, a capacitance type proximity sensor, a magnetic type proximity sensor, an infrared rays proximity sensor, and the like.

As one example, FIG. 1 illustrates a configuration of the related art proximity sensor.

The related proximity sensor, as illustrated in FIG. 1, includes a first light-emitting part 2 and a second light-emitting part 3 which output pulse-type optical signals belonging to an infrared wavelength band. A first pulse type optical signal output by the first light-emitting part 2 and a second pulse-type optical signal output by the second light-emitting part 3 have complementary forms to each other.

A light-receiving part 4 receives the first and second light signals output from the first light-emitting part 2 and the second light-emitting part 3, and a comparator 5 compares a combined value of the received first and second light signals with a zero ("0") signal 6.

Accordingly, a controller 7 determines whether or not an object approaches at the front of the first and second light-emitting parts 2 and 3 based on the comparison result obtained by the comparator 5.

When the light-receiving part 4 receives ambient light, it may receive light with high illumination, which is output from a halogen light source, or solar light as well as the infrared signals output from the first and second light-emitting parts 2 and 3. When the light with the high illumination is received by the light-receiving part 4 along with the infrared signals, the controller 7 may not recognize the infrared signals output from the first and second light-emitting parts 2 and 3. Accordingly, when the light with the high illumination is included in the ambient light received by the light-receiving part 4, the related art proximity sensor 1 fails to recognize a proximate object due to external light. This problem will be explained later in detail.

Consequently, there is a need to solve the problem that the proximity sensor using the optical signal fails to recognize the proximate object due to interference by the external light.

SUMMARY OF THE DISCLOSURE

Therefore, an aspect of the detailed description is to provide a proximity sensor, which is strong to interference by external light when recognizing a proximate object using an optical signal, and a control method thereof.

To achieve these and other advantages and in accordance with the purpose of this specification, as embodied and broadly described herein, there is provided a proximity sensor comprising including a light-emitting part that is configured to emit first light of a specific wavelength band, a light-receiving part that is configured to receive the first light and second light of a wavelength band different from that of the first light, and a controller that is configured to recognize a proximate object based on the first light reflected by the proximate object, wherein the controller changes a light-reception range of the light-receiving part based on the second light.

In accordance with one exemplary embodiment disclosed herein, the light-receiving part may include an ambient light receiving device that is configured to receive ambient light, and a filter that is configured to filter out the first light and the second light from the ambient light, the second light belonging to the different wavelength band from the first light.

In accordance with one exemplary embodiment disclosed herein, the light-receiving part may include a first light-receiving device that is configured to receive the first light, and a second light-receiving device that is configured to receive the second light.

In accordance with one exemplary embodiment disclosed herein, the first light may belong to an infrared light wavelength band, and the second light may belong to a visible light wavelength band.

In accordance with one exemplary embodiment disclosed herein, the light-emitting part may emit and may not emit the first light in a periodical manner.

In accordance with one exemplary embodiment disclosed herein, the proximity sensor may further include an analog-digital converter that is configured to convert an analog optical signal of the first light, received from the light-receiving part, into a digital optical signal.

In accordance with one exemplary embodiment disclosed herein, the controller may change an illumination range of the first light, converted by the analog-digital converter, based on illumination of the second light.

In accordance with one exemplary embodiment disclosed herein, the controller may increase the illumination range of the first light, converted by the analog-digital converter, when the second light has higher illumination, or decrease the illumination range of the first light, converted by the analog-digital converter, when the second light has lower illumination.

In accordance with one exemplary embodiment disclosed herein, the controller may change the first light, emitted by the light-emitting part, based on the second light.

In accordance with one exemplary embodiment disclosed herein, the controller may change a quantity of the first light, emitted by the light-emitting part, and a light-emitting duration of the first light based on the second light.

In accordance with one exemplary embodiment disclosed herein, the controller may change the quantity of the first light and the light-emitting duration thereof based on the illumination of the second light, such that a value obtained by integrating variation of illumination on the time basis can be uniform. Here, the variation of illumination may be caused by the reflected first light.

In accordance with one exemplary embodiment disclosed herein, the controller may control the output of the light-emitting part such that a value, which is obtained by integrating the quantity of the first light, emitted by the light-emitting part, on the basis of the light-emitting duration, increases when the second light has higher illumination. Or, the controller may control the output of the light-emitting part such that the value, which is obtained by integrating the quantity of the first light, emitted by the light-emitting part, on the basis of the light-emitting duration, decreases when the second light has lower illumination.

Also, the detailed description disclosed herein provides a terminal having the proximity sensor.

Also, the detailed description disclosed herein provides a mobile terminal which may include the proximity sensor, and a display unit that is configured to display information processed in the mobile terminal. Here, the display unit may have illumination varied based on the second light.

The detailed description disclosed herein also provides a vehicle control apparatus including the proximity sensor, and a display unit that is configured to display information processed in the vehicle control apparatus. Here, the display unit may have illumination varied based on the second light.

The detailed description disclosed herein provides a control method for a proximity sensor, including emitting first light of a specific wavelength band, receiving the first light and second light of a wavelength band different from that of the first light, changing a light-reception range of the first light based on the second light, and recognizing a proximate object based on the first light reflected by the proximate object.

In accordance with one exemplary embodiment disclosed herein, the receiving of the first light and the second light may include receiving the first light by a first light-receiving device, and receiving the second light by a second light-receiving device.

In accordance with one exemplary embodiment disclosed herein, the receiving of the first light and the second light may include receiving ambient light including the first light and the second light, and filtering out the first light and the second light from the ambient light.

In accordance with one exemplary embodiment disclosed herein, the changing of the light-reception range may be executed to change an illumination range of the first light based on illumination of the second light when an analog signal of the first light is converted into a digital signal.

In accordance with one exemplary embodiment disclosed herein, the control method may further include changing a quantity of the first light emitted and a light-emitting duration thereof based on the second light.

In accordance with one exemplary embodiment disclosed herein, the changing of the quantity of the first light and the light-emitting duration may be executed to change the quantity of the first light and the light-emitting duration thereof based on the illumination of the second light, such that a value obtained by integrating variation of illumination on the time basis can be uniform. Here, the variation of illumination may be caused by the reflected first light.

In a proximity sensor and a control method thereof according to one embodiment disclosed herein, a proximate object may be recognized using an optical signal, without suffering from an erroneous recognition caused duet o interference by external light.

Power consumption caused due to an output of a light-emitting part maybe reduced in a manner of changing (varying) a quantity of light output by the light-emitting part and a light-emitting duration according to illumination of external light.

As a light-emitting duration for which the light-emitting part emits light may vary according to illumination of external light, such that a user cannot visually recognize an output of the light-emitting part.

When a proximity sensor is installed at a position near a display unit, illumination of a light source included in the display device may be changed according to illumination of external light, such that brightness of the display unit can be adjusted adaptive to illumination of surroundings, without employing a separate illumination sensor.

Further scope of applicability of the present application will become more apparent from the detailed description given hereinafter. However, it should be understood that the detailed description and specific examples, while indicating preferred embodiments of the disclosure, are given by way of illustration only, since various changes and modifications within the spirit and scope of the disclosure will become apparent to those skilled in the art from the detailed description.

BRIEF DESCRIPTION OF THE DRAWINGS

The accompanying drawings, which are included to provide a further understanding of the disclosure and are incorporated in and constitute a part of this specification, illustrate exemplary embodiments and together with the description serve to explain the principles of the disclosure.

In the drawings:

FIG. 1 is a view illustrating a configuration of a proximity sensor according to the related art;

FIG. 2 is a view illustrating a configuration of a proximity sensor in accordance with one exemplary embodiment disclosed herein;

FIG. 3A is a view illustrating a configuration of a light-receiving part in accordance with a first embodiment disclosed herein;

FIG. 3B is a view illustrating configuration of a light-receiving part in accordance with a second embodiment disclosed herein;

FIG. 16 is a flowchart illustrating sequential steps of a control method for a proximity sensor in accordance with another exemplary embodiment disclosed herein.

DETAILED DESCRIPTION OF THE DISCLOSURE

Figure 4:
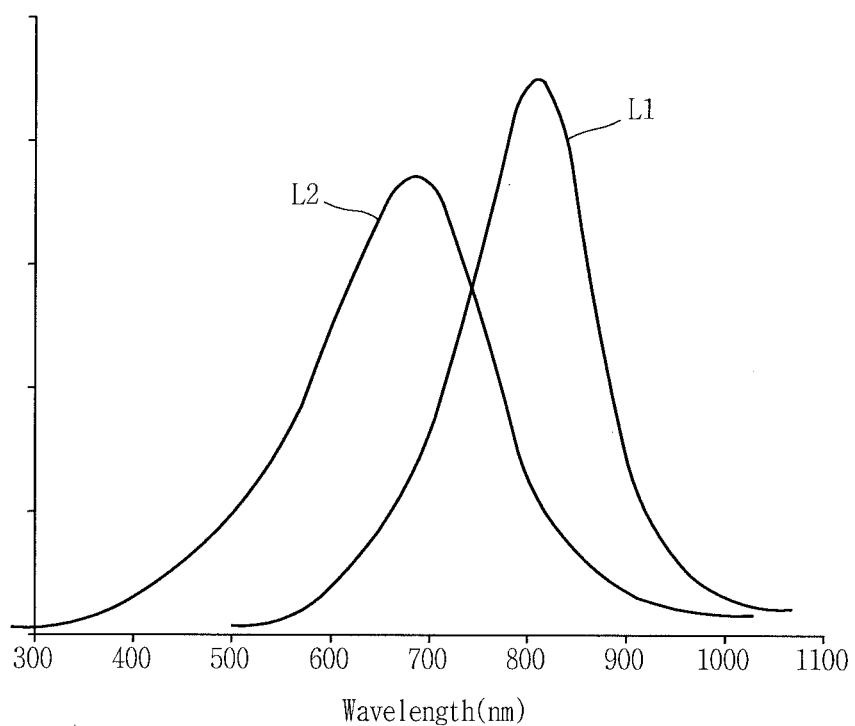
FIG. 4 is a graph showing intensities of first and second light according to wavelengths thereof in accordance with one exemplary embodiment disclosed herein.

Description will now be given in detail of preferred configurations of mobile terminals according to the present invention, with reference to the accompanying drawings. It should be noted that technological terms used herein are merely used to describe a specific embodiment, but not to limit the present invention. Also, unless particularly defined otherwise, technological terms used herein should be construed as a meaning that is generally understood by those having ordinary skill in the art to which the invention pertains, and should not be construed too broadly or too narrowly. Furthermore, if technological terms used herein are wrong terms unable to correctly express the spirit of the invention, then they should be replaced by technological terms that are properly understood by those skilled in the art. In addition, general terms used in this invention should be construed based on the definition of dictionary, or the context, and should not be construed too broadly or too narrowly.

Incidentally, unless clearly used otherwise, expressions in the singular number include a plural meaning. In this application, the terms "comprising" and "including" should not be construed to necessarily include all of the elements or steps disclosed herein, and should be construed not to include some of the elements or steps thereof, or should be construed to further include additional elements or steps. In addition, a suffix "module" or "unit" used for constituent elements disclosed in the following description is merely intended for easy description of the specification, and the suffix itself does not give any special meaning or function.

Furthermore, the terms including an ordinal number such as first, second, etc. can be used to describe various elements, but the elements should not be limited by those terms. The terms are used merely for the purpose to distinguish an element from the other element. For example, a first element may be named to a second element, and similarly, a second element may be named to a first element without departing from the scope of right of the invention.

Hereinafter, preferred embodiments of the present invention will be described in detail with reference to the accompanying drawings, and the same or similar elements are designated with the same numeral references regardless of the numerals in the drawings and their redundant description will be omitted.

In describing the present invention, moreover, the detailed description will be omitted when a specific description for publicly known technologies to which the invention pertains is judged to obscure the gist of the present invention. Also, it should be noted that the accompanying drawings are merely illustrated to easily explain the spirit of the invention, and therefore, they should not be construed to limit the spirit of the invention by the accompanying drawings.

First Exemplary Embodiment

FIG. 2 is a view illustrating a configuration of a proximity sensor in accordance with one exemplary embodiment disclosed herein.

As illustrated in FIG. 2, a proximity sensor 10 in accordance with one exemplary embodiment disclosed herein includes a light-emitting part 12 that emits first light of a specific wavelength band, a light-receiving part 13 that receives the first light and second light of a wavelength band different from that of the first light, and a controller 11 that recognizes a proximate object based on the first light reflected by the proximate object. Here, the controller 11 changes (varies) a light-reception range of the light-receiving part 13 based on the second light.

The light-emitting part 12 is an element of outputting light by an electric signal, and may emit light in response to a current applied from a power supply unit (not illustrated). Here, the light-emitting part 12 may output the first light of the specific wavelength band. The light-emitting part 12 may be a light emitting diode (LED), for example.

Here, the first light of the specific wavelength band preferably belongs to an infrared light wavelength band in which light has a relatively longer wavelength than external light, such as halogen light source or solar light. In detail, the first light may have a wavelength peak in the range of 850 to 950 nm. That is, the first light may have wavelengths, the peak of which belongs to a range of 100 nm based on 900 nm.

The light-emitting part 12 outputs the first light of an infrared light wavelength band and accordingly a user cannot visually recognize the light-emitting part 12 from the outside.

The light-receiving part 13 is an element which receives ambient light and converts the received light into an electric signal. The light-receiving part 13 receives external light output from various types of light sources as well as the first light emitted from the light-emitting part 12. The light-receiving part 13 may be a photo diode, for example.

Here, the external light has a wavelength band different from the first light. The wavelength of the external light may belong to a visible light wavelength range in which light has a relatively shorter wavelength than that of the first light. That is, the external light may generally have a wavelength range of 380 to 770 nm. For the sake of explanation herein, the term "external light" and the term "second light" will be used with the same meaning.

Intensities of first and second light according to wavelengths in accordance with one exemplary embodiment are illustrated in a graph of FIG. 4.

Meanwhile, the light-receiving part 13 which receives ambient light may also receive first and second light included in the ambient light.

FIG. 3A is a view illustrating a configuration of a light-receiving part in accordance with a first embodiment disclosed herein, and FIG. 3B is a view illustrating configuration of a light-receiving part in accordance with a second embodiment disclosed herein.

As illustrated in FIG. 3A, the light-receiving part 13 may include an ambient light receiving device 13a and a filter 13b.

The ambient light receiving device 13a may receive ambient light including first and second light L1 and L2, and the filter 13b may filter out the first light L1 and the second light L2 from the received ambient light according to a preset wavelength range.

Here, the filtering of the first light L1 and the second light L2 from the ambient light using the filter 13b may be achieved by various well-known methods, so detailed description thereof will be omitted.

In accordance with another exemplary embodiment, as illustrated in FIG. 3B, the light-receiving part 13 may include a first light-receiving device 13c and a second light-receiving device 13d.

The light-receiving part 13 may include the plurality of light-receiving devices 13c and 13d, so as to individually receive the first light L1 and the second light L2 thereby.

The first light-receiving device 13c is a device which can receive only the first light included in the ambient light. The first light-receiving device 13c may receive only light of a specific wavelength corresponding to the first light of the ambient light.

Also, the second light-receiving device 13d is a device which can receive only the second light included in the ambient light. The second light-receiving device 13d may receive only light of a specific wavelength corresponding to the second light of the ambient light.

In order to receive only light of specific wavelengths, the first and second light-receiving devices 13c and 13d may use materials, which have different response characteristics according to wavelengths, or use a filter. However, without being limited to that, the first and second light-receiving devices 13c and 13d may receive light in such condition by various well-known methods.

The controller 11 recognizes a proximate object based on the first light which has been emitted from the light-emitting part 12, reflected by the proximate object and then received in the light-receiving part. Here, an optical signal of the first light emitted by the light-emitting part 12 may have a pulse type that the first light is emitted or is not emitted in a periodical manner.

According to one exemplary embodiment, the controller 11 may calculate a distance between the proximity sensor 10 and the proximate object which reflects the first light, using a value obtained by integrating the reflected first light for a predetermined period of time.

In detail, the controller 11 may calculate a distance from the proximity sensor 10 to the proximate object in a manner of comparing a value, which is obtained by integrating the reflected first light for the predetermined period of time, with a preset integration value, and applying the comparison result to a reference distance corresponding to the preset integration value.

According to another exemplary embodiment, the controller 11 may compare the first light emitted from the light-emitting part 12 with the first light which has been reflected by the proximate object and received in the light-receiving part 13, and recognize the proximate object based on the comparison result.

In detail, the controller 11 may calculate a distance between the proximity sensor 10 and the proximate object which has reflected the first light, using an intensity difference and a phase difference between the first light and the reflected first light.

The detailed method of calculating the distance between the proximity sensor and a reflecting body of the first light using the comparison result between the first light and the reflected first light may be implemented by various well-known methods, so detailed description will be omitted.

Also, a plurality of proximity sensors 10 may be provided into an array arrangement. Accordingly, the plurality of proximity sensors 10 may calculate the distance up to the proximate object, respectively, such that coordinates of an installation area of one of the plurality of proximity sensors 10, on which the proximate object is located, can be calculated using the reflectively calculated distances.

Meanwhile, the proximity sensor 10 according to one exemplary embodiment, as illustrated in FIG. 2, may further include an analog-digital convertor 14 provided between the light-receiving part 13 and the controller 11, namely, at a rear end of the light-receiving part 13.

The analog-digital converter 14 converts an analog optical signal received from the light-receiving part 13 into a digital optical signal.

The analog-digital converter 14 may also convert an illumination value of light received by the light-receiving part 13 into the digital signal. The converted optical signal may be an analog optical signal of the first light of the ambient light.

Here, the analog-digital converter 14 according to the one exemplary embodiment may convert the first light, which belongs to a predetermined illumination range having a lower limit and an upper limit of an illumination value, into a digital signal when converting the analog optical signal of the first light into the digital signal.

Meanwhile, the controller 11 may change a light-reception range of the light-receiving part 13 based on the second light.

In accordance with one exemplary embodiment, when the light-receiving part 13 includes the first light-receiving device 13c and the second light-receiving device 13d, the light-reception range of the first light-receiving device 13c may change.

The light-reception range may be an illumination range of light which the light-receiving part 13 receives.

In general, since light received by the light-receiving part 13 is not limited to have a predetermined range of illumination, when the light-reception range of the light-receiving part 13 is wide in the related art, the controller 11 is unable to recognize variation of the first light due to the proximate object reflecting the first light of pulse type output from the light-emitting part 12.

Figure 5A:
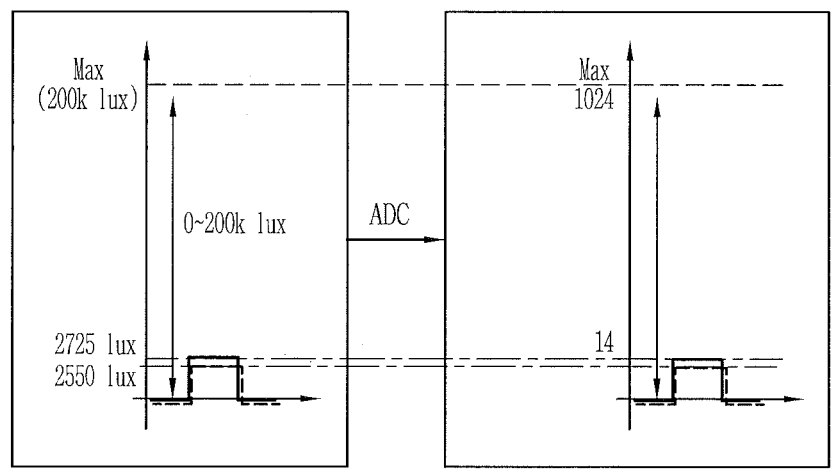
FIG. 5A is a view illustrating variation of illumination of received light according to the related art.

In detail, as illustrated in FIG. 5A, if it is assumed that the light-emitting part 12 outputs the first light of pulse type with illumination of 2725 lux and the illumination of the first light reflected by a proximate object is 2550 lux, when the light-reception range of the light-receiving part 13 is 0 to 200 lux, the first light and the reflected first light have an illumination difference of 175 lux. Therefore, the controller 11 cannot recognize the proximate object.

That is, when the analog-digital converter 14 converts the analog optical signal of the first light into a 10-bit digital signal, a 1-bit digital value indicates approximately 195 lux ($=200$ k$\div 2^{\wedge}10$). The controller 11 is thus unable to recognize variation below 195 lux.

For recognizing the variation below 195 lux, there is requirement for an analog-digital converter which is capable of supporting the conversion from the analog optical signal into a 10-bit digital signal or greater. However, the analog-digital converter 14 having such high resolution requires for a high unit cost and also requires the controller 11 to have high functionality for processing the 10-bit digital signal or greater.

Therefore, the controller 11 according to the one exemplary embodiment may change the light-reception range of the light-receiving part 13 based on the second light, in more detail, based on illumination of the second light, thereby solving the problem.

Figure 5B:
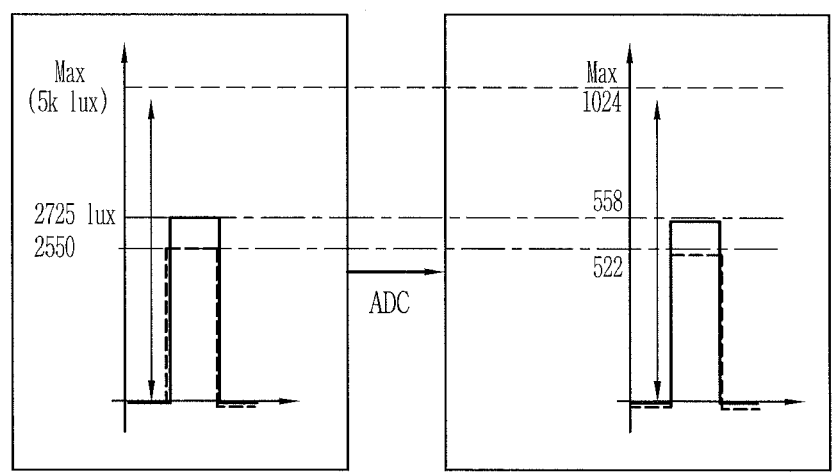
FIG. 5B is a view illustrating variation of illumination of light based on a changed light-reception range in accordance with one exemplary embodiment disclosed herein.

In detail, as illustrated in FIG. 5B, the controller 11 may reduce the light-reception range of the light-receiving part 13 in a manner of lowering an upper limit of the light-reception range from a preset light-reception range of 0 to 200 k lux to a range of 0 to 5000 lux. Accordingly, when the analog-digital converter 14 converts the analog optical signal of the first light into the 10-bit digital signal, the 1-bit digital value is about 5 lux ($(=5000\div 2^{\wedge}10)$. Therefore, the controller may recognize the variation of illumination of 175 lux, resulting in improvement of recognition efficiency with respect to the proximate object.

That is, the light-reception range of the light-receiving part 13 adaptively varies according to illumination of ambient light, specifically, illumination of the second light. This may derive improvement of resolution even without replacement of the analog-digital converter 14, so as to enhance a recognition rate for the proximate object.

In other words, as the second light has higher illumination, the controller 11 according to the one exemplary embodiment may more decrease an illumination range of the first light which the analog-digital converter 14 converts. Also, as the second light has lower illumination, the controller 11 may increase the illumination range of the first light which the analog-digital converter 14 converts.

Figure 9:
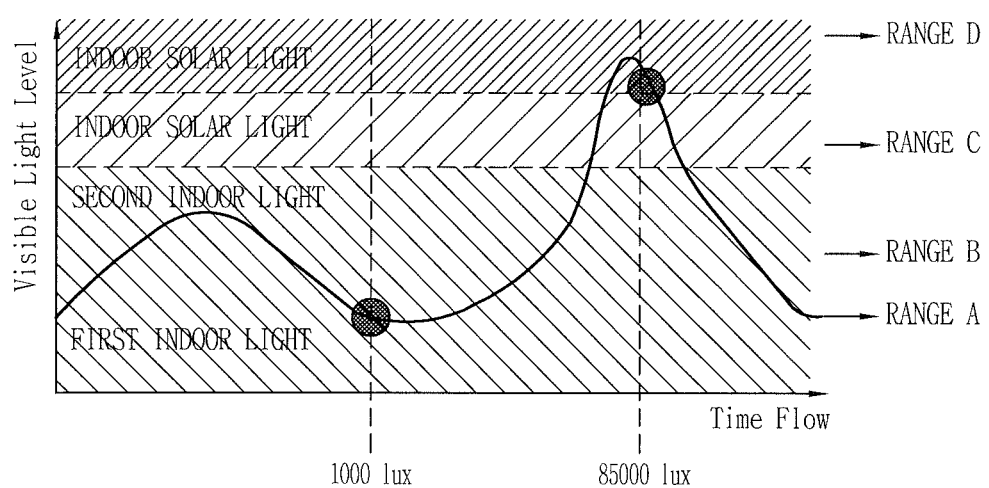
FIG. 9 is a view illustrating an example of variation of illumination of external light on the time basis.

FIG. 9 is a view illustrating an example of changes in illumination of external light on the time basis.

Hereinafter, cases where external light is a first indoor light, a second indoor light, indoor solar light and outdoor solar light will be referred to as a range A, a range B, a range C and a range D, respectively.

Figure 10A:
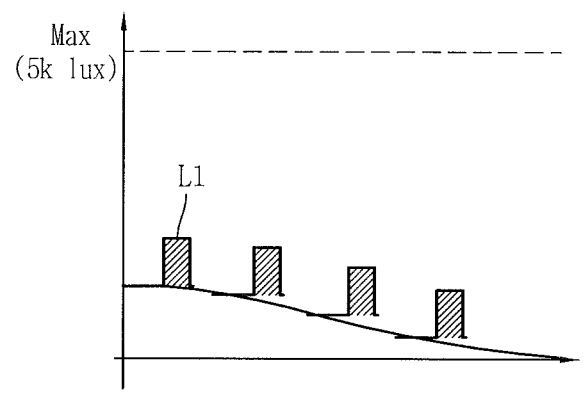
FIGS. 10A(a) and 10A(b) are views illustrating illumination of light received by a light-receiving part on the time basis when external light is a first indoor light.
Figure 10A:
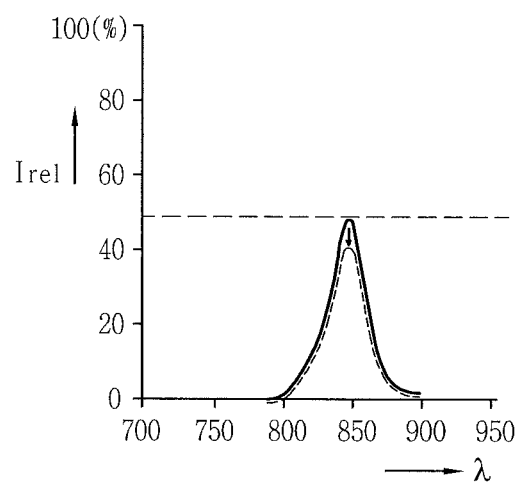
Figure 10B:
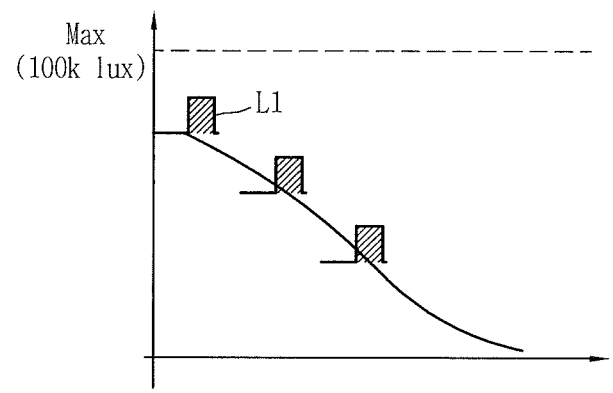
FIGS. 10B(a) and 10B(b) are views illustrating illumination of light received by a light-receiving part on the time basis when external light is outdoor solar light.
Figure 10B:
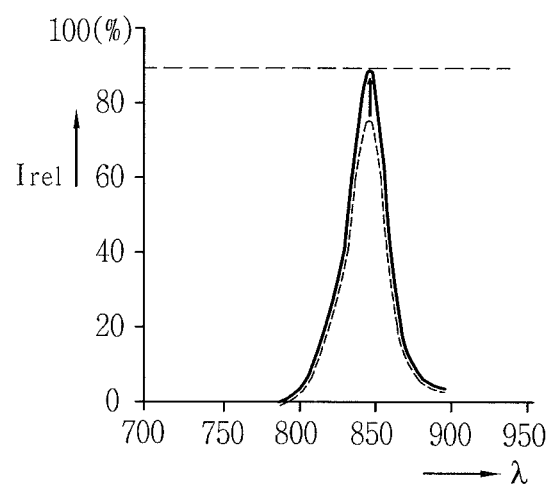

FIG. 10A is a view illustrating illumination of light received by a light-receiving part on the time basis when external light is a first indoor light, and FIG. 10B is a view illustrating illumination of light received by a light-receiving part on the time basis when external light is outdoor solar light.

As illustrated in FIGS. 10A and 10B, when external light is a first indoor light of 1000 lux, the controller 11, as illustrated in FIG. 10A, may set the light-reception range of the light-receiving part 13 to a range of 0 to 5000 lux. When external light is outdoor solar light of 85000 lux, the controller 11, as illustrated in FIG. 10B, may set the light-reception range of the light-receiving part 13 to a range of 0 to 100 k lux.

The light-reception range according to each of the ranges A to D may be set as shown in the following Table 1, according to one embodiment.

TABLE 1

|  | Range A | Range B | Range C | Range D |
| --- | --- | --- | --- | --- |
| Signal Range | Normal (0~5k lux) | Normal (0~5k lux) | High (0~200k lux) | High (0~200k lux) |

Here, variation of the light-reception range according to illumination of the second light may depend on a preset conversion table or a preset conversion formula. Also, the relation between the illumination of the second light and the light-reception range may be continuous, but may not be limited thereto. The relation therebetween may also be non-continuous according to areas divided as the ranges A to D.

In such a manner, the controller 11 may vary (change) the light-reception range according to the illumination of the second light and recognize the first light reflected by the proximate object based on the changed light-reception range. This may result in solving a problem of a lowered recognition rate even if external light varies.

Second Exemplary Embodiment

Figure 6A:
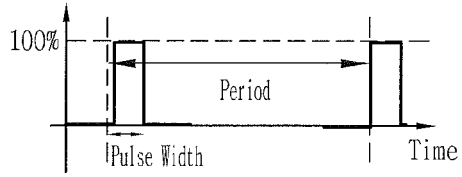
FIGS. 6A(a), 6A(b), 6B(a) and 6B(b) are views illustrating an optical signal output by a light-emitting part of a proximity sensor and an optical signal received by a light-receiving part of the proximity sensor.
Figure 6A:
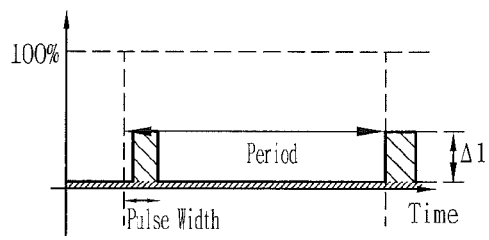
Figure 6B:
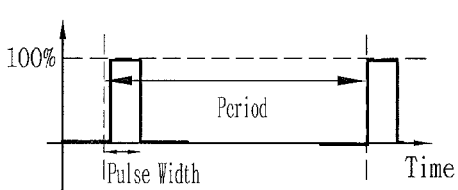
Figure 6B:
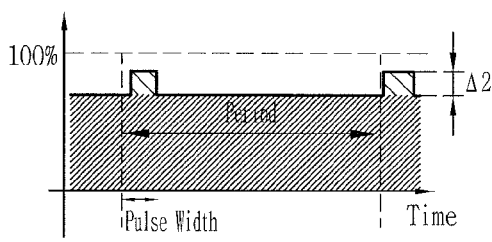

FIGS. 6A and 6B are views illustrating an optical signal output by a light-emitting part of a proximity sensor and an optical signal received by a light-receiving part of the proximity sensor.

As illustrated in (a) of FIG. 6A, an optic signal output by the light-emitting part 12 is a signal of pulse type which has a predetermined period with a predetermined pulse width. Here, the light-emitting part 12 outputs a quantity of light corresponding to a driving current applied to the light-emitting part 12 during the predetermined pulse width.

As illustrated in (a) of FIG. 6A, when external light like the first indoor light has a low illumination value, a considerable rate of light received by the light-receiving part 13 is occupied by the first light or the reflected first light by the proximate object (see (b) of FIG. 6A). Therefore, the proximity sensor does not suffer from recognizing the proximate object using the variation of the reflected first light.

However, as illustrated in (a) of FIG. 6B, when external light like outdoor solar light has a high illumination value, a low rate of light received by the light-receiving part 13 is occupied by the first light or the reflected first light by the proximate object (see (b) of FIG. 6B). Therefore, the proximity sensor suffers from recognizing the proximate object using the variation of the reflected first light. Consequently, it may be preferable to increase a quantity of the first light output by the light-emitting part 12.

Figure 7A:
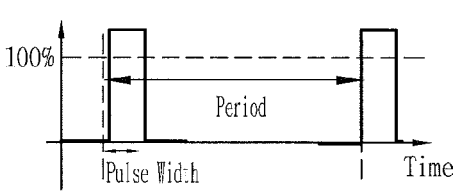
FIGS. 7(a) and 7(b) are views illustrating an optical signal output by a light-emitting part of a proximity sensor and an optical signal received by a light-receiving part of the proximity sensor in accordance with one exemplary embodiment disclosed herein.
Figure 7B:
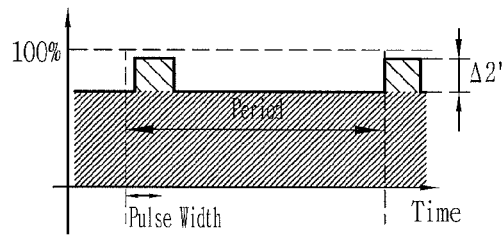

In such a manner, when the second light has higher illumination, the controller 11 according to the one exemplary embodiment, as illustrated in (a) of FIG. 7, may increase the quantity of the first light emitted by the light-emitting part 12. Thus, even though illumination of external light is high, the controller 11 may relatively increase the ratio that the first light occupies light received in the light-receiving part 13 (see (b) of FIG. 7). This may allow the proximity sensor to recognize the proximate object using the variation of the reflected first light.

Figure 8A:
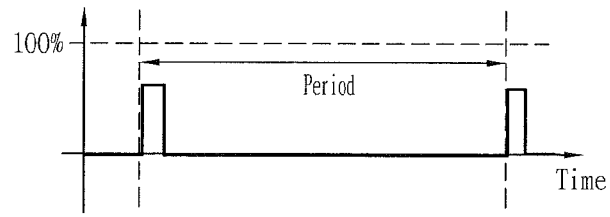
FIGS. 8A(a), 8A(b), 8B(a), and 8B(b) are views illustrating an example in which a quantity of light output by a light-emitting part and a light-emitting time duration are changed in accordance with one exemplary embodiment disclosed herein.
Figure 8A:
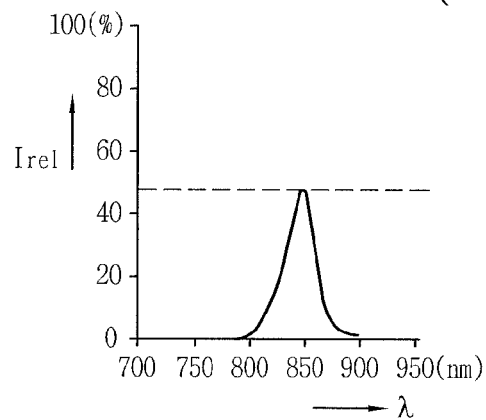
Figure 8B:
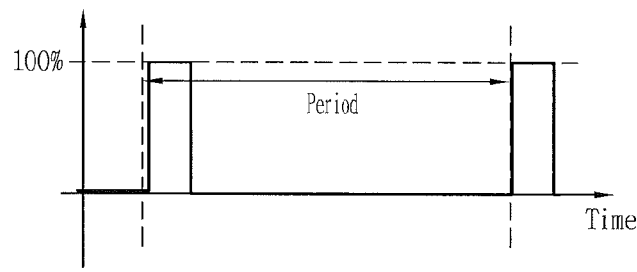
Figure 8B:
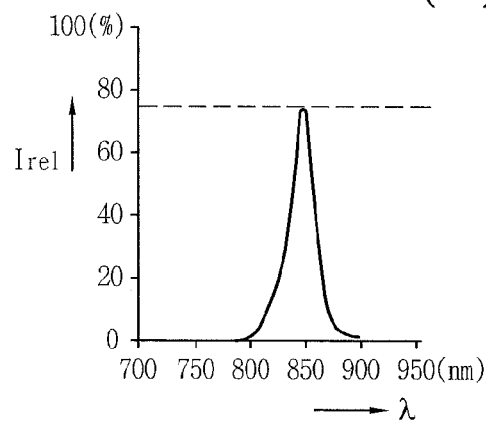

FIGS. 8A and 8B are views illustrating an example in which a quantity of light output by a light-emitting part and a light-emitting time duration are changed in accordance with one exemplary embodiment disclosed herein.

As illustrated in FIG. 8A, when external light is a first indoor light, since the second light received in the light-receiving part 13 has a small illumination value, the controller 11 according to the one exemplary embodiment may apply a lower current than a current which is applied for a maximum output of the light-emitting part 12 (see (a) of FIG. 8). Accordingly, showing the first light emitted by the light-emitting part 12, a current value applied according to a wavelength or a quantity of light emitted according to the wavelength may be illustrated as shown in (b) of FIG. 8A.

Meanwhile, referring to FIG. 8B, when external light is outdoor solar light, since the second light received by the light-receiving part 13 has a great illumination value, the controller 11 according to the one exemplary embodiment may apply a relatively greater current to the light-emitting part 12 than a current applied when external light is a first indoor light (see (a) of FIG. 8B). Showing the first light emitted by the light-emitting part 12, a current value applied according to a wavelength or a quantity of light emitted according to the wavelength may be illustrated as shown in (b) of FIG. 8B.

That is, since a quantity of light with respect to an optical signal output by the light-emitting part 12 varies according to illumination of external light received by the light-receiving part 13, power consumption caused due to the output of the light-emitting part 12 may be reduced.

Also, it has been illustrated that the controller 11 according to the one exemplary embodiment can adjust the quantity of the first light output by the light-emitting part 12 and the light-emitting duration according to the illumination of the second light. However, the quantity of the first light emitted by the light-emitting part 12 and the light-emitting duration thereof are preferably adjustable such that a value obtained by integrating the variation of illumination, which is derived due to the first light reflected by the proximate object, on the time basis can be uniform.

In detail, the controller 11 may control an output of the light-emitting part 12 such that a value obtained by integrating variation of illumination, which is derived due to the first light reflected by the proximate object, on the time basis can be uniform even if illumination of external light belongs to any of the ranges A to D.

That is, when external light is a first indoor light and outdoor solar light, respectively, the external light received by the light-receiving part 13 and the reflected first light are illustrated in (b) of FIG. 6A and (b) of FIG. 6B, respectively.

Here, the controller 11 may decide the quantity of the first light emitted by the light-emitting part 12 and the light-emitting duration thereof in such a manner that an illumination variation Δ1 generated by the first light illustrated in (b) of FIG. 6A and an illumination variation Δ2 generated by the first light illustrated in (b) of FIG. 6B are the same as each other.

Accordingly, the controller 11 may more increase the quantity and/or the light-emitting duration of the first light emitted by the light-emitting part 12 when the second light has higher illumination, and more decrease the quantity and/or the light-emitting duration of the first light emitted by the light-emitting part 12 when the second light has low illumination.

In other words, the controller 11 may increase a value, which is obtained by integrating the quantity of the first light emitted by the light-emitting part 12 on the basis of the light-emitting duration when the second light has the higher illumination, or decrease the value obtained by integrating the first light emitted by the light-emitting part 12 on the basis of the light-emitting duration when the second light has the low illumination.

The quantity and/or the light-emitting duration of the first light emitted by the light-emitting part 12 according to the ranges A to D may be set as illustrated in the following Table 2, according to one embodiment.

TABLE 2

|  | Range A | Range B | Range C | Range D |
| --- | --- | --- | --- | --- |
| Driving Signal Pulse Width | Small 1 (25.56 μs) | Small 2 (50.12 μs) | High 1 (25.56 μs) | High 2 (50.12 μs) |

Here, the changes of the quantity and the light-emitting duration of the first light according to the illumination of the second light may be based on a preset conversion table or a preset conversion formula. Also, the relation between the illumination of the second light and the pulse type of the first light (quantity of light and light-emitting duration) may be continuous, but may not be limited thereto. The relation therebetween may also be non-continuous according to areas divided as the ranges A to D.

In such a manner, when the first light output by the light-emitting part 12 changes according to illumination of external light, the quantity and/or the light-emitting duration of the first light change accordingly. This may result in a reduction of power consumption caused due to the output of the light-emitting part 12 and also the user cannot visually recognize the light-emitting part 12, more particularly, a light-emitting diode even if the light emitting diode is exposed outwardly.

Third Exemplary Embodiment

A proximity sensor according to this exemplary embodiment may be connected with a power source or a backlight unit (BLU) included in a display unit of a terminal.

Terminals such as a mobile terminal, a vehicle control apparatus and the like are provided with a proximity sensor according to the present disclosure. Illumination of the display unit on which information processed in the terminal is output changes based on second light received in the proximity sensor.

In detail, the display unit included in the terminal may perform an On/Off control of a light source, a control of a quantity of light output from the light source, a control of an output time of the light source, a control of output wavelength of the light source and the like. Here, the controller 11 may control illumination of the light source or the display unit based on illumination of second light included in ambient light, which is received by the light-receiving unit 13.

According to one exemplary embodiment, when external light is outdoor solar light, the controller 11 controls the illumination of the display unit such that brightness of the display unit can be adjusted to be darker or brighter.

Therefore, when the proximity sensor 10 disclosed herein is installed at a position adjacent to the display unit of the terminal, brightness of the display unit may be adjustable according to illumination of external light. Consequently, the brightness of the display unit can be automatically adjusted adaptive to illumination around the display unit, without further employing an optical sensor for controlling the brightness of the display unit.

Terminal

A proximity sensor disclosed herein may be applied to various types of terminals, specifically, various terminals including the display device.

In detail, a mobile terminal (including a wearable device interoperable with the mobile terminal) may be applied to a vehicle control apparatus which is installed in a vehicle so as to control the vehicle.

Mobile terminals presented herein may be implemented using a variety of different types of terminals. Examples of such terminals include cellular phones, smart phones, laptop computers, digital broadcast terminals, personal digital assistants (PDAs), portable multimedia players (PMPs), navigators, slate PCs, tablet PCs, ultra books, wearable devices and the like. By way of non-limiting example only, further description will be made with reference to particular types of mobile terminals. However, such teachings apply equally to other types of terminals, such as those types noted above. In addition, these teachings may also be applied to stationary terminals such as digital TV, desktop computers, and the like.

Also, the vehicle control apparatus disclosed herein may be applied to various devices or apparatuses, such as telemetics terminals, navigation terminals, audio video navigation (AVN) terminals, televisions, 3D televisions, audio/video (A/V) systems, information providing centers, call centers and the like.

The vehicle control apparatus disclosed herein may also be implemented into a type of a mobile terminal which is connected to the vehicle in a wired or wireless manner. Here, the vehicle control apparatus, similar to the mobile terminal, may include cellular phones, smart phones, laptop computers, digital broadcast terminals, personal digital assistants (PDAs), portable multimedia players (PMPs), navigators, slate PCs, tablet PCs, ultra books, wearable devices and the like.

Hereinafter, description will be given of configurations of a mobile terminal and a vehicle control apparatus with reference to FIGS. 11 to 14B.

Figure 11:
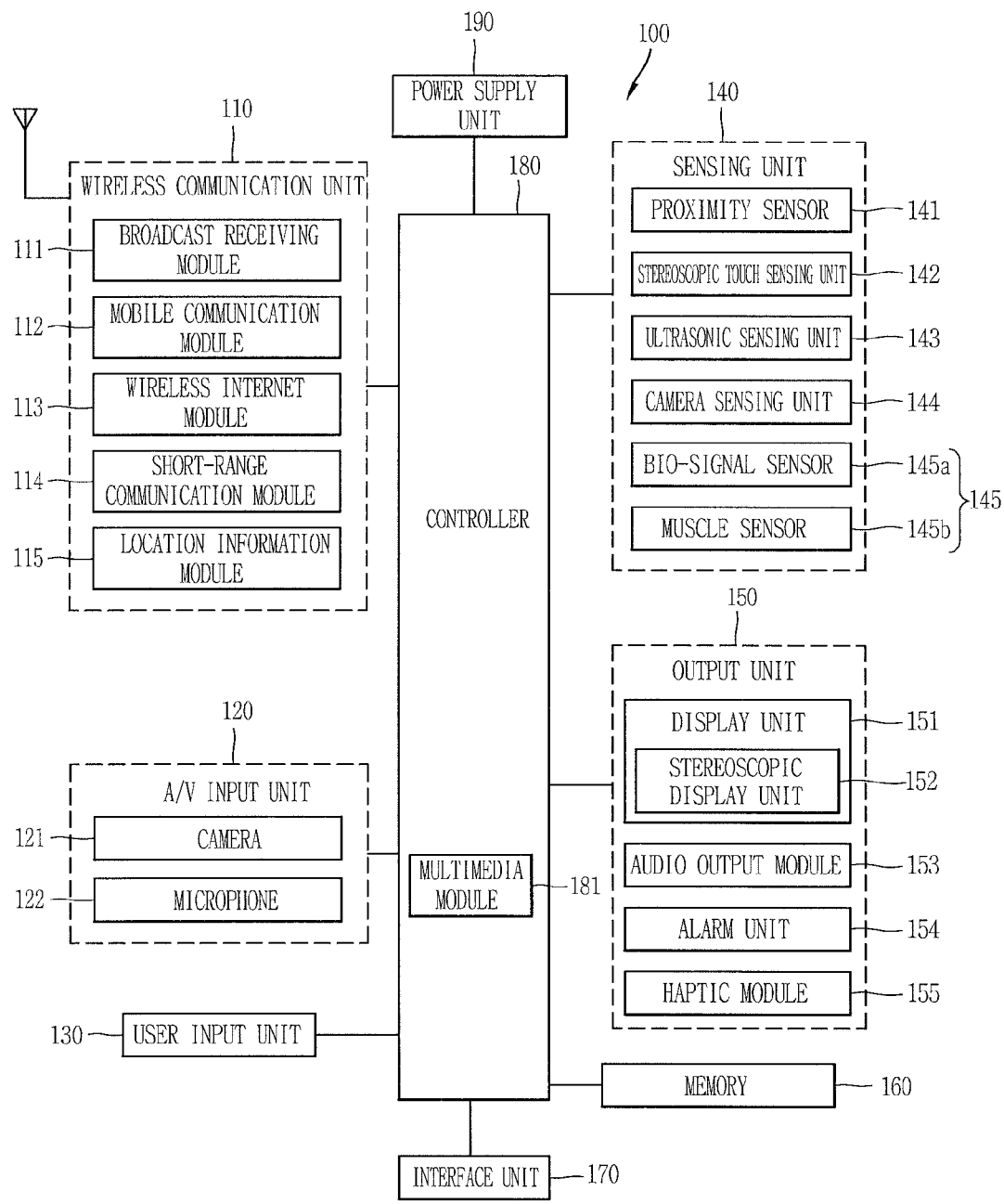
FIG. 11 is a view illustrating a configuration of a mobile terminal having a proximity sensor in accordance with one exemplary embodiment disclosed herein.

FIG. 11 is a view illustrating a configuration of a mobile terminal having a proximity sensor in accordance with one exemplary embodiment disclosed herein.

The mobile terminal 100 is shown having components such as a wireless communication unit 110, an A/V input unit 120, a user input unit 130, a sensing unit 140, an output unit 150, an interface unit 160, a memory 170, a controller 180, and a power supply unit 190. It is understood that implementing all of the illustrated components is not a requirement, and that greater or fewer components may alternatively be implemented.

Hereinafter, the constituent elements will be described in turn.

The wireless communication unit 110 typically includes one or more elements allowing radio communication between the mobile terminal 100 and a wireless communication system, or allowing radio communication between the mobile terminal 100 and a network in which the mobile terminal 100 is located. For example, the wireless communication unit 110 may include a broadcast receiving module 111, a mobile communication module 112, a wireless Internet module 113, a short-range communication module 114, a location information module 115, and the like.

The broadcast receiving module 111 receives broadcast signals and/or broadcast associated information from an external broadcast management server through a broadcast channel.

The broadcast channel may include a satellite channel and/or a terrestrial channel. The broadcast management server may mean a server that generates and transmits a broadcast signal and/or broadcast associated information or a server that receives a previously generated broadcast signal and/or broadcast associated information and transmits to the mobile terminal 100. The broadcast signal may include a TV broadcast signal, a radio broadcast signal and a data broadcast signal as well as a broadcast signal in a form that a data broadcast signal is coupled to the TV or radio broadcast signal.

The broadcast associated information may mean information regarding a broadcast channel, a broadcast program, a broadcast service provider, and the like. The broadcast associated information may also be provided through a mobile communication network, and in this case, the broadcast associated information may be received by the mobile communication module 112.

The broadcast associated information may exist in various forms. For example, it may exist in the form of an electronic program guide (EPG) of digital multimedia broadcasting (DMB), electronic service guide (ESG) of digital video broadcast-handheld (DVB-H), and the like.

The broadcast receiving module 111 may receive a broadcast signal using various types of broadcast systems. In particular, the broadcast receiving module 111 may receive a digital broadcast signal using a digital broadcast system such as digital multimedia broadcasting-terrestrial (DMB-T), digital multimedia broadcasting-satellite (DMB-S), media forward link only (MediaFLO), digital video broadcast-hand held (DVB-H), integrated services digital broadcast-terrestrial (ISDB-T), and the like. The broadcast receiving module 111 is, of course, configured to be suitable for every broadcast system that provides a broadcast signal as well as the above-mentioned digital broadcast systems.

Broadcast signals and/or broadcast associated information received via the broadcast receiving module 111 may be stored in a suitable device, such as a memory 160.

The mobile communication module 112 transmits and/or receives a radio signal to and/or from at least one of a base station, an external terminal and a server over a mobile communication network. In this exemplary embodiment, the radio signal may include a voice call signal, a video call signal and/or various types of data according to text and/or multimedia message transmission and/or reception.

The mobile communication module 112 may implement a video (telephony) call mode and a voice call mode. The video call mode indicates a state of calling with watching a callee's image. The voice call mode indicates a state of calling without watching the callee's image. The wireless communication module 112 may transmit and receive at least one of voice and image in order to implement the video call mode and the voice call mode.

The wireless internet module 113 may support wireless Internet access for the mobile terminal. This module may be internally or externally coupled to the mobile terminal. Examples of such wireless Internet access may include Wireless LAN (WLAN), wireless fidelity (Wi-Fi) direct, digital living network alliance (DLNA), Wireless Broadband (Wibro), World Interoperability for Microwave Access (Wimax), High Speed Downlink Packet Access (HSDPA), and the like.

The short-range communication module 114 is a module for supporting a short-range communication. In this exemplary embodiment, it may be used a short-range communication technology including Bluetooth™, Radio Frequency IDentification (RFID), Infrared Data Association (IrDA), Ultra WideBand (UWB), ZigBee, Near Field communication (NFC), and the like.

The location information module 115 denotes a module for detecting or calculating a position of the mobile terminal. An example of the location information module 115 may include a Global Position System (GPS) module or a WiFi module.

Referring to FIG. 11, the A/V input unit 120 is configured to provide audio or video signal input to the mobile terminal. The A/V input unit 120 may include a camera 121 and a microphone 122. The camera 121 receives and processes image frames of still pictures or video obtained by image sensors in a video call mode or a capturing mode. The processed image frames may be displayed on a display unit 151.

The location information module 115 denotes a module for detecting or calculating a position of the mobile terminal. An example of the location information module 115 may include a Global Position System (GPS) module or a WiFi module.

Still referring to FIG. 1, the A/V input unit 120 may be configured to provide an audio or video signal input to the mobile terminal. The A/V input unit 120 may include a camera 121 and a microphone 122. The camera 121 may receive and process image frames of still pictures or video obtained by image sensors in a video call mode or a capture mode. The processed image frames may be displayed on a display unit 151.

The image frames processed by the camera 121 may be stored in the memory 160 or transmitted to an external device via the wireless communication unit 110. Also, user's position information and the like may be calculated from the image frames acquired by the camera 121. Two or more cameras 121 may be provided according to the configuration of the mobile terminal.

The microphone 122 may receive an external audio signal while the mobile terminal is in a particular mode, such as a phone call mode, a recording mode, a voice recognition mode, or the like. This audio signal may then be processed into digital data. The processed digital data may be converted for output into a format transmittable to a mobile communication base station via the mobile communication module 112 in case of the phone call mode. The microphone 122 may include assorted noise removing algorithms to remove noise generated in the course of receiving the external audio signal.

The user input unit 130 may generate data input by a user to control the operation of the mobile terminal. The user input unit 130 may include a keypad, a dome switch, a touchpad (e.g., static pressure/capacitance), a jog wheel, a jog switch and the like.

The sensing unit 140 may provide status measurements of various aspects of the mobile terminal. For instance, the sensing unit 140 may detect an open/close status of the mobile terminal 100, a location of the mobile terminal 100, a presence or absence of user contact with the mobile terminal 100, an orientation of the mobile terminal 100, acceleration/deceleration of the mobile terminal 100, and the like, so as to generate a sensing signal for controlling the operation of the mobile terminal 100. For example, regarding a slide phone type mobile terminal, the sensing unit 140 may sense whether the slide phone type mobile terminal is open or closed. Other examples may include sensing statuses, the presence or absence of power provided by the power supply 190, the presence or absence of a coupling or other connection between the interface unit 170 and an external device, and the like.

The output unit 150 may be configured to output an audio signal, a video signal or a tactile signal. The output unit 150 may include a display unit 151, an audio output module 153, an alarm unit 154, a haptic module 155.

The display unit 151 may output information processed in the mobile terminal 100. For example, when the mobile terminal is operating in a phone call mode, the display unit 151 may provide a User Interface (UI) or a Graphic User Interface (GUI), which includes information associated with the call. As another example, if the mobile terminal is in a video call mode or a capture mode, the display unit 151 may additionally or alternatively display images captured and/or received, UI, or GUI.

The display unit 151 may be implemented using, for example, at least one of a Liquid Crystal Display (LCD), a Thin Film Transistor-Liquid Crystal Display (TFT-LCD), an Organic Light-Emitting Diode (OLED), a flexible display, a three-dimensional (3D) display, an e-ink display, and the like.

Some of such displays may be implemented as a transparent type or an optical transparent type through which the exterior is visible, which is referred to as a transparent display. A representative example of the transparent display may include a Transparent OLED (TOLED), or the like. The rear surface of the display unit 151 may also be implemented to be optically transparent. Under this configuration, a user can view an object positioned at a rear side of a terminal body through a region occupied by the display unit 151 of the terminal body.

The display unit 151 may be implemented in two or more in number according to a configured aspect of the mobile terminal 100. For instance, a plurality of the display units 151 may be arranged on one surface to be spaced apart from or integrated with each other, or may be arranged on different surfaces.

The display unit 151 may also be implemented as a stereoscopic display unit for displaying stereoscopic images.

Here, the stereoscopic image may be a three-dimensional (3D) stereoscopic image. The 3D stereoscopic image refers to an image making a viewer feel that a gradual depth and reality of an object on a monitor or a screen is the same as a realistic space. The 3D stereoscopic image may be implemented by using binocular disparity. Binocular disparity refers to disparity made by the positions of two eyes. When two eyes view different 2D images, the images are transferred to the brain through the retina and combined in the brain to provide the perception of depth and reality sense.

The stereoscopic display unit 152 may employ a stereoscopic display scheme such as stereoscopic scheme (a glass scheme), an auto-stereoscopic scheme (glassless scheme), a projection scheme (holographic scheme), or the like. Stereoscopic schemes commonly used for home television receivers, or the like, may include Wheatstone stereoscopic scheme, or the like.

The auto-stereoscopic scheme may include, for example, a parallax barrier scheme, a lenticular scheme, an integral imaging scheme, a switchable lens, or the like. The projection scheme may include a reflective holographic scheme, a transmissive holographic scheme, and the like.

In general, a 3D stereoscopic image may be comprised of a left image (a left eye image) and a right image (a right eye image). According to how left and right images are combined into a 3D stereoscopic image, a 3D stereoscopic imaging method may be divided into a top-down method in which left and right images are disposed up and down in a frame, an L-to-R (left-to-right or side by side) method in which left and right images are disposed left and right in a frame, a checker board method in which fragments of left and right images are disposed in a tile form, an interlaced method in which left and right images are alternately disposed by columns or rows, and a time sequential (or frame by frame) method in which left and right images are alternately displayed on a time basis.

Also, as for a 3D thumbnail image, a left image thumbnail and a right image thumbnail may be generated from a left image and a right image of an original image frame, respectively, and then combined to generate a single 3D thumbnail image. In general, thumbnail refers to a reduced image or a reduced still image. The thusly generated left image thumbnail and the right image thumbnail may be displayed with a horizontal distance difference therebetween by a depth corresponding to the disparity between the left image and the right image on the screen, providing a stereoscopic space sense.

A left image and a right image required for implementing a 3D stereoscopic image may be displayed on the stereoscopic display unit 152 by a stereoscopic processing unit (not shown). The stereoscopic processing unit may receive the 3D image and extract the left image and the right image, or may receive the 2D image and change it into a left image and a right image.

Here, if the display unit 151 and a touch sensitive sensor (referred to as a 'touch sensor') have a layered structure therebetween (referred to as a 'touch screen'), the display unit 151 may be used as an input device as well as an output device. The touch sensor may be implemented as a touch film, a touch sheet, a touchpad, and the like.

The touch sensor may be configured to convert changes of pressure applied to a specific part of the display unit 151, or a capacitance occurring from a specific part of the display unit 151, into electric input signals. Also, the touch sensor may be configured to sense not only a touched position and a touched area, but also touch pressure. Here, a touch object is an object to apply a touch input onto the touch sensor. Examples of the touch object may include a finger, a touch pen, a stylus pen, a pointer or the like.

When touch inputs are sensed by the touch sensors, corresponding signals may be transmitted to a touch controller. The touch controller may process the received signals, and then transmit corresponding data to the controller 180. Accordingly, the controller 180 may sense which region of the display unit 151 has been touched.

Still referring to FIG. 11, a proximity sensor 141 may be arranged at an inner region of the mobile terminal covered by the touch screen, or near the touch screen. The proximity sensor 141 may be provided as one example of the sensing unit 140. The proximity sensor 141 refers to a sensor to sense presence or absence of an object approaching to a surface to be sensed, or an object disposed near a surface to be sensed, by using an electromagnetic field or infrared rays without a mechanical contact. The proximity sensor 141 may have a longer lifespan and a more enhanced utility than a contact sensor.

The proximity sensor 141 may include a transmissive type photoelectric sensor, a direct reflective type photoelectric sensor, a mirror reflective type photoelectric sensor, a high-frequency oscillation proximity sensor, a capacitance type proximity sensor, a magnetic type proximity sensor, an infrared rays proximity sensor, and so on. When the touch screen is implemented as a capacitance type, proximity of a pointer to the touch screen may be sensed by changes of an electromagnetic field. In this case, the touch screen (touch sensor) may be categorized into a proximity sensor.

Hereinafter, for the sake of brief explanation, a status that the pointer is positioned to be proximate onto the touch screen without contact will be referred to as 'proximity touch', whereas a status that the pointer substantially comes in contact with the touch screen will be referred to as 'contact touch'. For the position corresponding to the proximity touch of the pointer on the touch screen, such position will correspond to a position where the pointer faces perpendicular to the touch screen upon the proximity touch of the pointer.

The proximity sensor 141 may sense proximity touch, and proximity touch patterns (e.g., distance, direction, speed, time, position, moving status, etc.). Information relating to the sensed proximity touch and the sensed proximity touch patterns may be output onto the touch screen.

When a touch sensor is overlaid on the stereoscopic display unit 152 in a layered manner (hereinafter, referred to as a 'stereoscopic touch screen'), or when the stereoscopic display unit 152 and a 3D sensor sensing a touch operation are combined, the stereoscopic display unit 152 may also be used as a 3D input device.

As examples of the 3D sensor, the sensing unit 140 may include a proximity sensor 141, a stereoscopic touch sensing unit 142, an ultrasonic sensing unit 143, a camera sensing unit 144, and a bio-information acquiring unit 145.

The proximity sensor 141 may detect the distance between a sensing object (for example, the user's finger or a stylus pen), applying a touch by using the force of electromagnetism or infrared rays without a mechanical contact, and a detect surface. By using the distance, the terminal may recognize which portion of a stereoscopic image has been touched. In particular, when the touch screen is an electrostatic touch screen, the degree of proximity of the sensing object may be detected based on a change of an electric field according to proximity of the sensing object, and a touch to the 3D image may be recognized by using the degree of proximity.

The proximity sensor 141 disclosed herein will be understood by the foregoing description, so detailed description thereof will be omitted.

The stereoscopic touch sensing unit 142 may be configured to detect the strength or duration of a touch applied to the touch screen. For example, the stereoscopic touch sensing unit 142 may sense touch pressure. When the pressure is strong, it may recognize the touch as a touch with respect to an object located farther away from the touch screen toward the inside of the terminal.

The ultrasonic sensing unit 143 may be configured to recognize position information relating to the sensing object by using ultrasonic waves.

The ultrasonic sensing unit 143 may include, for example, an optical sensor and a plurality of ultrasonic sensors. The optical sensor may be configured to sense light and the ultrasonic sensors may be configured to sense ultrasonic waves. Since light is much faster than ultrasonic waves, a time for which the light reaches the optical sensor may be much shorter than a time for which the ultrasonic wave reaches the ultrasonic sensor. Therefore, a position of a wave generation source may be calculated by using a time difference from the time that the ultrasonic wave reaches based on the light as a reference signal.

The camera sensing unit 144 may include at least one of the camera 121, a photo sensor, and a laser sensor.

For example, the camera 121 and the laser sensor may be combined to detect a touch of the sensing object with respect to a 3D stereoscopic image. When distance information detected by a laser sensor is added to a 2D image captured by the camera, 3D information can be obtained.

In another example, a photo sensor may be laminated on the display device. The photo sensor may be configured to scan a movement of the sensing object in proximity to the touch screen. In more detail, the photo sensor may include photo diodes and transistors at rows and columns to scan content mounted on the photo sensor by using an electrical signal changing according to the quantity of applied light. Namely, the photo sensor may calculate the coordinates of the sensing object according to variation of light to thus obtain position information of the sensing object.

The bio-information acquiring unit 145 acquires bio-information through a user's specific body portion.

For example, the bio-information acquiring unit 145 may measure a biometric signal which is generated due to a bio-potential difference of a human body.

For example, the bio-information acquiring unit 145 may include at least one of pulse plethyamography (PPG), electro-cardiogram (ECG), galvanic skin reflex (GSR), electro-encephalogram (EEG), electro-myogram (EMG) and electrooculography (EOG) sensors. Those sensors may measure biometric signals with respect to pulse blood flow, ballistocardiogram, galvanic skin reflex, brain waves, electromyogram, and eyeball movements.

The audio output module 153 may output audio data received from the wireless communication unit 110 or stored in the memory 160 in a call signal reception mode, a call mode, a record mode, a voice recognition mode, a broadcast reception mode, and the like. Also, the audio output module 153 may provide audible output signals related to a particular function (e.g., a call signal reception sound, a message reception sound, etc.) performed by the mobile terminal 100. The audio output module 153 may include a receiver, a speaker, a buzzer or the like.

The alarm unit 154 may output a signal for informing about an occurrence of an event of the mobile terminal 100. Events generated in the mobile terminal, for example, may include call signal reception, message reception, key signal inputs, a touch input, etc. In addition to video or audio signals, the alarm unit 154 may output signals in a different manner, for example, using vibration to inform of an occurrence of an event. The video or audio signals may also be output via the display unit 151 and the audio output module 153. Hence, the display unit 151 and the audio output module 153 may be classified as parts of the alarm unit 154.

A haptic module 155 may generate various tactile effects that user may feel. A typical example of the tactile effect generated by the haptic module 155 is vibration. Strength, pattern and the like of the vibration generated by the haptic module 155 may be controllable by a user selection or setting of the controller. For example, different vibrations may be combined to be outputted or sequentially outputted.

Besides vibration, the haptic module 155 may generate various other tactile effects, including an effect by stimulation such as a pin arrangement vertically moving with respect to a contact skin, a spray force or suction force of air through a jet orifice or a suction opening, a touch on the skin, a contact of an electrode, electrostatic force, etc., an effect by reproducing the sense of cold and warmth using an element that can absorb or generate heat, and the like.

The haptic module 155 may be implemented to allow the user to feel a tactile effect through a muscle sensation such as the user's fingers or arm, as well as transferring the tactile effect through a direct contact. Two or more haptic modules 155 may be provided according to the configuration of the mobile terminal 100.

The memory 160 may store programs used for operations performed by the controller, or may temporarily store input and/or output data (for example, a phonebook, messages, still images, video, etc.). In addition, the memory 160 may store data regarding various patterns of vibrations and audio signals output when a touch input is sensed on the touch screen.

The memory 160 may include at least one type of storage medium including a Flash memory, a hard disk, a multimedia card micro type, a card-type memory (e.g., SD or DX memory, etc), a Random Access Memory (RAM), a Static Random Access Memory (SRAM), a Read-Only Memory (ROM), an Electrically Erasable Programmable Read-Only Memory (EEPROM), a Programmable Read-Only memory (PROM), a magnetic memory, a magnetic disk, and an optical disk. Also, the mobile terminal 100 may be operated in relation to a web storage device that performs the storage function of the memory 160 over the Internet.

The interface unit 170 may serve as an interface with every external device connected with the mobile terminal 100. For example, the interface unit 170 may receive data transmitted from an external device, receive power to transfer to each element within the mobile terminal 100, or transmit internal data of the mobile terminal 100 to an external device. For example, the interface unit 170 may include wired or wireless headset ports, external power supply ports, wired or wireless data ports, memory card ports, ports for connecting a device having an identification module, audio input/output (I/O) ports, video I/O ports, earphone ports, or the like.

The identification module may be a chip that stores various information for authenticating authority of using the mobile terminal 100 and may include a user identity module (UIM), a subscriber identity module (SIM), a universal subscriber identity module (USIM), and the like. In addition, the device having the identification module (referred to as 'identifying device', hereinafter) may take the form of a smart card. Accordingly, the identifying device may be connected with the terminal 100 via the interface unit 170.

When the mobile terminal 100 is connected with an external cradle, the interface unit 170 may serve as a passage to allow power from the cradle to be supplied to the mobile terminal 100 therethrough or may serve as a passage to allow various command signals input by the user from the cradle to be transferred to the mobile terminal therethrough. Various command signals or power input from the cradle may operate as signals for recognizing that the mobile terminal is properly mounted on the cradle.

The controller 180 may typically control the general operations of the mobile terminal 100. For example, the controller 180 may perform controlling and processing associated with voice calls, data communications, video calls, and the like. The controller 180 may include a multimedia module 181 for playbacking multimedia data. The multimedia module 181 may be configured within the controller 180 or may be configured to be separated from the controller 180.

The controller 180 may perform pattern recognition processing to recognize a handwriting input or a picture drawing input performed on the touch screen as characters or images, respectively.

Also, the controller 180 may execute a lock state to restrict a user from inputting control commands for applications when a state of the mobile terminal meets a preset condition. Also, the controller 180 may control a lock screen displayed in the lock state based on a touch input sensed on the display unit 151 in the lock state of the mobile terminal.

The power supply unit 190 may receive external power or internal power and supply appropriate power required for operating respective elements and components under the control of the controller 180.

Various embodiments described herein may be implemented in a computer-readable or its similar medium using, for example, software, hardware, or any combination thereof.

For hardware implementation, the embodiments described herein may be implemented by using at least one of Application Specific Integrated Circuits (ASICs), Digital Signal Processors (DSPs), Digital Signal Processing Devices (DSPDs), Programmable Logic Devices (PLDs), Field Programmable Gate Arrays (FPGAs), processors, controllers, micro-controllers, microprocessors, and electronic units designed to perform the functions described herein. In some cases, such embodiments may be implemented by the controller 180 itself.

For software implementation, the embodiments such as procedures or functions described herein may be implemented by separate software modules. Each software module may perform one or more functions or operations described herein.

Software codes can be implemented by a software application written in any suitable programming language. The software codes may be stored in the memory 160 and executed by the controller 180.

Hereinafter, description will be given of various implemented forms of a mobile terminal according to one exemplary embodiment with reference to FIGS. 12A to 14B.

Figure 12A:
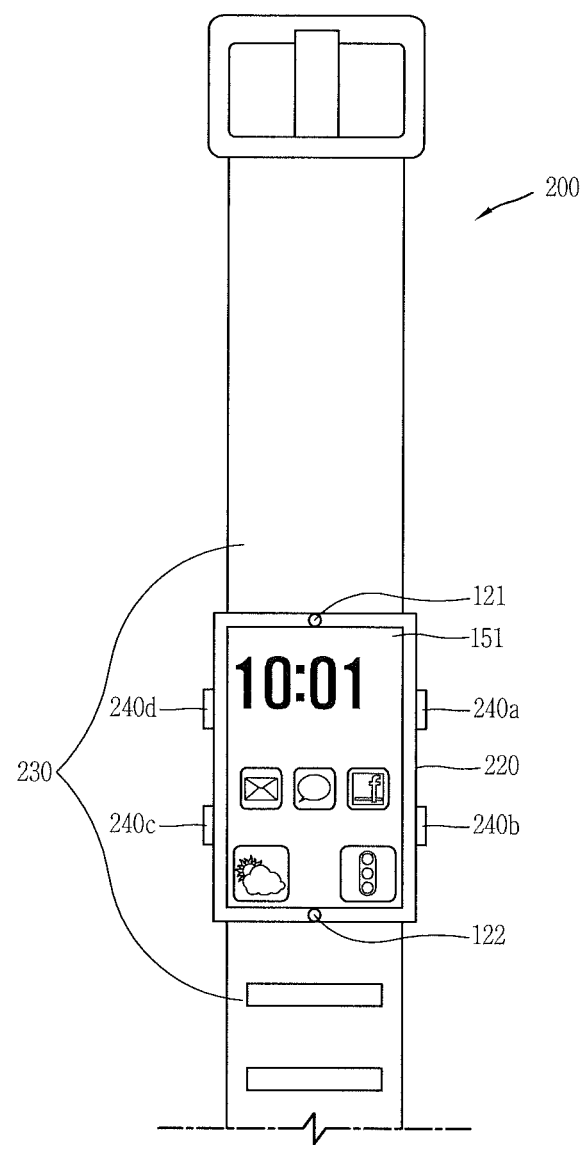
FIGS. 12A and 12B are front and rear views of a smart watch in accordance with one exemplary embodiment disclosed herein.
Figure 12B:
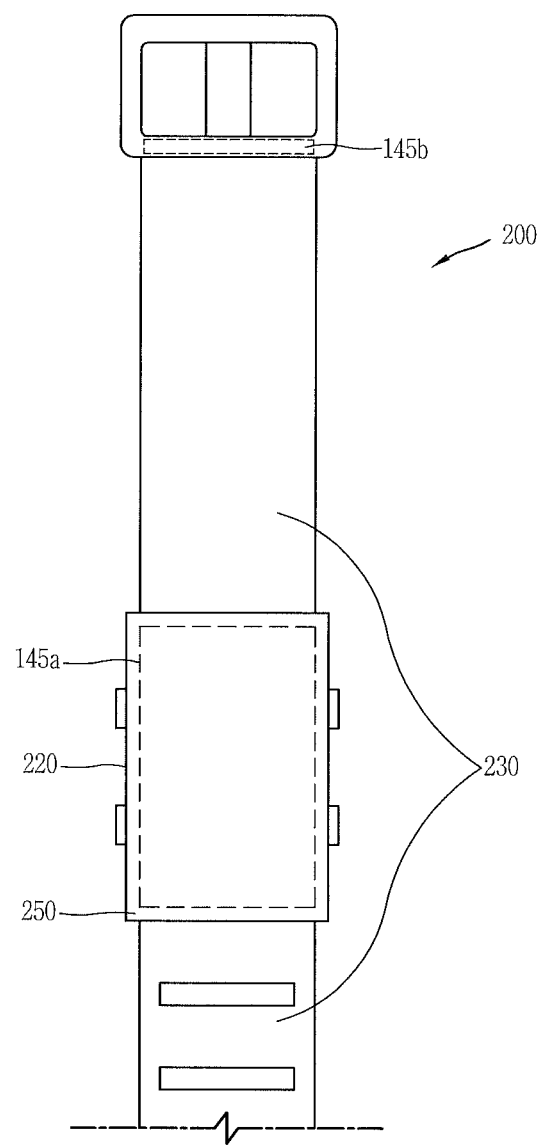

FIGS. 12A and 12B are front and rear views of a smart watch in accordance with one exemplary embodiment disclosed herein. That is, FIGS. 12A and 12B illustrates a case where the mobile terminal 100 adopts a smart watch type, as a watch type mobile terminal, among types of a wearable device.

A smart watch 200 disclosed herein exemplarily has a rectangular structure, but may not be limited to this structure. That is, the present disclosure may also be applicable to smart watches having a polygonal structure, such as a circular structure or a triangular structure.

For example, the smart watch 200 includes a band 230 and a main body 220. A case defining an appearance of the main body 220 may be divided into a front case 210 and a rear case 250. Various electronic components are incorporated into a space formed between the front case 210 and the rear case 250. At least one middle case may be additionally disposed between the front case 210 and the rear case 250. The cases may be formed by injection-molding a synthetic resin or may be also formed of a metal, for example, stainless steel (STS), titanium (Ti), or the like.

Referring to FIG. 12A, the front case 210 is shown having a display unit 151, a camera 121, a microphone 122 and the like.

The display unit 151 occupies a most portion of the principal surface of the front case 210. The camera 121 and the microphone 122 may be disposed on both end portions of the display unit 151.

Meanwhile, the display unit 151 may display various types of visual information. Those information may be displayed in the form of characters, numbers, symbols, graphics, icons and the like.

For inputting those information, at least one of the characters, numbers, symbols, graphics, icons and the like may be displayed into a predetermined arrangement so as to be implemented into a type of keypad. The type of keypad may be referred to as 'soft key.'

The display unit 151 may operate as an entire area or by being divided into a plurality of areas. For the latter, the plurality of areas may be configured to be cooperative with one another.

One side surface of the main body 220 of the smart watch 200 may be shown having a wired/wireless headset port (not illustrated) and a wired/wireless data port (not illustrated). The ports may be configured as examples of the interface unit 170 (see FIG. 11).

As illustrated in FIG. 12B, a rear surface of the main body 220, namely, the rear case 250 may be shown having a bio-signal sensor 145a. The bio-signal sensor 145a may be a sensor for sensing a user's skin state or a user's biometric signal. Also, a muscle sensor 145b for sensing a user's muscle movement and the like may be disposed on at least one area of the band 230 which actually comes in contact with a rear skin of the user's wrist.

A broadcast signal receiving antenna may further be disposed on a side surface of the main body 220. An antenna forming a part of the broadcast receiving module 111 (see FIG. 11) may be inserted into and drawn out of the main body 220.

An audio output module (not illustrated, an interface unit and the like may be provided on the main body 220 of the smart watch 200. A user input unit 340, a connection port and the like may be provided on side surfaces of the front case 210 and the rear case 250.

The user input unit 240 may generate input data to control an operation of the terminal, and include at least one manipulation units 240a, 240b, 240c and 240d. The manipulation units may be referred to as a manipulating portion. Such manipulating portion can employ any tactile manner that a user can touch or tap for manipulation.

The plurality of manipulation units may be set to allow inputting of various contents. For example, the plurality of manipulation units may be configured to input commands such as START, END, SCROLL or the like, and configured to input commands, such as a volume adjustment of sounds output from the audio output module 452, conversion of the display unit 151 into a touch recognition mode, or the like.

The connection port may receive data from external devices, transfer supplied power to each component within the smart watch 200, or transmit internal data of the smart watch 200 to external devices. The connection port may be configured as one example of the interface unit 170 (see FIG. 11).

A power supply unit (not illustrated) for supplying power to the smart watch 200 is provided at the main body 220 of the smart watch 200. The power supply unit may be implemented into a form embedded in the main body 220.

Hereinafter, description will be given of a structure of the mobile terminal having those components illustrated in FIG. 11, with reference to FIGS. 13A and 13B.

Figure 13A:
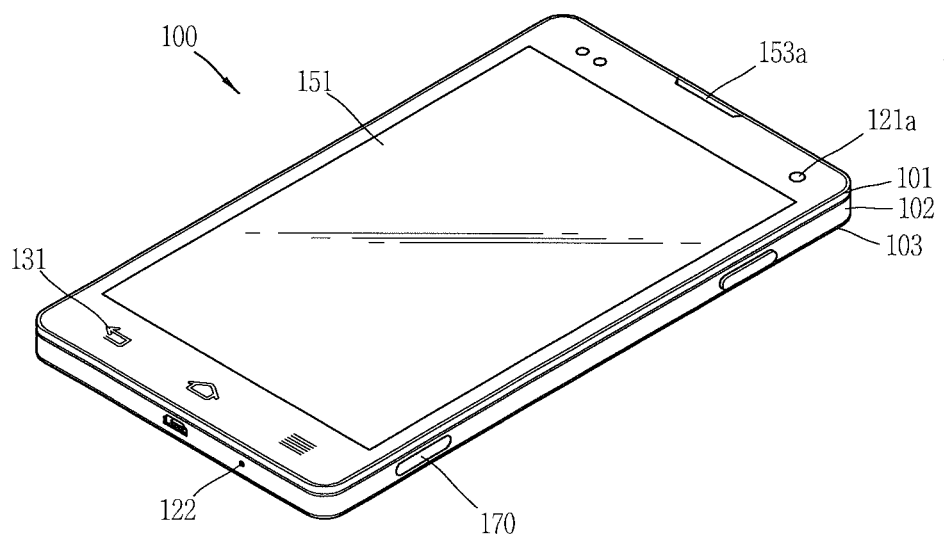
FIG. 13A is a front perspective view of a mobile terminal in accordance with one exemplary embodiment disclosed herein.

FIG. 13A is a perspective front view of a mobile terminal in accordance with one exemplary embodiment disclosed herein.

The mobile terminal 100 is described with reference to a bar-type terminal body. However, the mobile terminal 100 may alternatively be implemented in any of a variety of different configurations. Examples of such configurations include watch-type, clip-type, glasses-type, or as a folder-type, flip-type, slide-type, swing-type, and swivel-type in which two and more bodies are combined with each other in a relatively movable manner, and combinations thereof.

The body may include a case (casing, housing, cover, etc.) forming the appearance of the terminal. In this embodiment, the case may be divided into a front case 101 and a rear surface 102. Various electronic components may be incorporated into a space formed between the front case 101 and the rear case 102. At least one middle case may be additionally disposed between the front case 101 and the rear case 102. A battery cover 103 covering a batter 191 may be detachably provided at the rear case 102.

The cases may be formed by injection-molding synthetic resin or may be formed of a metal, for example, stainless steel (STS), titanium (Ti), or the like.

A display unit 151, a first audio output module 153*a*, a first camera 121*a*, a first manipulation unit 131 and the like may be provided on the front surface of the terminal body, and a microphone 122, an interface unit 170, a second manipulation unit 132 and the like may be disposed on a side surface of the terminal body.

The display unit 151 outputs information processed in the mobile terminal 100. The display unit 151 may be implemented using one or more suitable display devices to display visual information. Examples of such suitable display devices may include a liquid crystal display (LCD), a thin film transistor-liquid crystal display (TFT-LCD), an organic light emitting diode (OLED), a flexible display, a 3-dimensional (3D) display, an e-ink display, and combinations thereof.

The display unit 151 may include a touch sensing means to receive a control command by a touch method. When a touch is made to any one place on the display unit 151, the touch sensing means may be configured to sense this touch and enter the content corresponding to the touched place. The content entered by a touch method may be a text or numerical value, or a menu item capable of indication or designation in various modes.

The touch sensing means may be formed with transparency to allow visual information displayed on the display unit 151 to be seen, and may include a structure for enhancing the visibility of a touch screen at bright places. Referring to FIG. 3A, the display unit 151 occupies a most portion of the front surface of the front case 101.

The first audio output unit 153*a* and the first camera 121*a* are disposed in a region adjacent to one of both ends of the display unit 151, and the first manipulation input unit 131 and the microphone 122 are disposed in a region adjacent to the other end thereof. The second manipulation interface 132 (refer to FIG. B), the interface 170, and the like may be disposed on a lateral surface of the terminal body.

The first audio output module 153*a* may be implemented in the form of a receiver for transferring voice sounds to the user's ear or a loud speaker for outputting various alarm sounds or multimedia reproduction sounds.

It may be configured such that the sounds generated from the first audio output module 153*a* are released along an assembly gap between the structural bodies. In this case, a hole independently formed to output audio sounds may not be seen or hidden in terms of appearance, thereby further simplifying the appearance of the mobile terminal 100. However, the present invention may not be limited to this, but a hole for releasing the sounds may be formed on the window.

The first camera 121*a* processes video frames such as still or moving images obtained by the image sensor in a video call mode or capture mode. The processed video frames may be displayed on the display unit 151.

The user input unit 130 is manipulated to receive a command for controlling the operation of the mobile terminal 100. The user input unit 130 may include a first and a second manipulation unit 131, 132. The first and the second manipulation unit 131, 132 may be commonly referred to as a manipulating portion, and any method may be employed if it is a tactile manner allowing the user to perform manipulation with a tactile feeling such as touch, push, scroll or the like.

In the present drawing, it is illustrated on the basis that the first manipulation unit 131 is a touch key, but the present disclosure may not be necessarily limited to this. For example, the first manipulation unit 131 may be configured with a mechanical key, or a combination of a touch key and a mechanical key.

The content received by the first and/or second manipulation units 131, 132 may be set in various ways. For example, the first manipulation unit 131 may be used to receive a command such as menu, home key, cancel, search, or the like, and the second manipulation unit 132 may receive a command, such as controlling a volume level being outputted from the first audio output module 153*a*, or switching into a touch recognition mode of the display unit 151.

The microphone 122 may be formed to receive the user's voice, other sounds, or the like. The microphone 122 may be provided at a plurality of places, and configured to receive stereo sounds.

The interface unit 170 serves as a path allowing the mobile terminal 100 to exchange data with external devices. For example, the interface unit 170 may be at least one of a connection terminal for connecting to an earphone in a wired or wireless manner, a port for near field communication (for example, an Infrared Data Association (IrDA) port, a Bluetooth port, a wireless LAN port, and the like), and a power supply terminal for supplying power to the mobile terminal 100. The interface unit 170 may be implemented in the form of a socket for accommodating an external card such as Subscriber Identification Module (SIM) or User Identity Module (UIM), and a memory card for information storage.

Figure 13B:
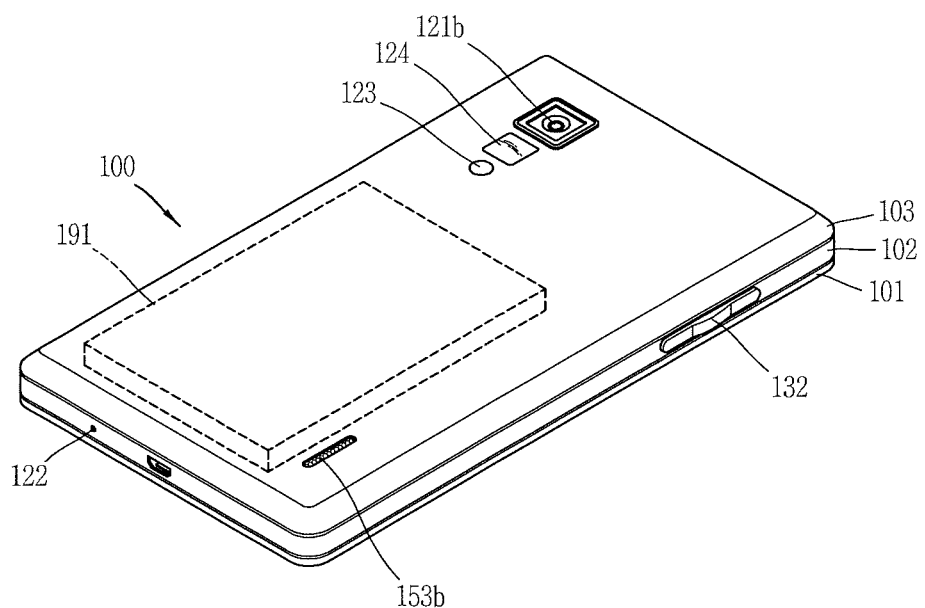
FIG. 13B is a rear perspective view of the mobile terminal illustrated in FIG. 13A.

FIG. 13B is a rear perspective view of the mobile terminal illustrated in FIG. 13A.

As illustrated in FIG. 13B, a second camera 121*b* may be additionally mounted at a rear surface of the terminal body, namely, the rear case 102. The second camera 121*b* has an image capturing direction, which is substantially opposite to the direction of the first camera unit 121*a* (refer to FIG. 3A), and may have a different number of pixels from that of the first camera unit 121*a*.

For example, it is preferable that the first camera 121*a* has a relatively small number of pixels enough not to cause difficulty when the user captures his or her own face and sends it to the other party during a video call or the like, and the second camera 121*b* has a relatively large number of pixels since the user often captures a general object that is not sent immediately. The first and the second camera 121*a*, 121*b* may be provided in the terminal body in a rotatable and popupable manner.

Furthermore, a flash 123 and a mirror 124 may be additionally disposed adjacent to the second camera 121b. The flash 123 illuminates light toward an object when capturing the object with the second camera 121b. The mirror 124 allows the user to look at his or her own face, or the like, in a reflected way when capturing himself or herself (in a self-portrait mode) by using the second camera 121b.

A second audio output unit 153b may be additionally disposed at a rear surface of the terminal body. The second audio output unit 153b together with the first audio output unit 153a (refer to FIG. 3A) can implement a stereo function, and may be also used to implement a speaker phone mode during a phone call.

An antenna (not shown) for receiving broadcast signals may be additionally disposed at a lateral surface of the terminal body in addition to an antenna for making a phone call or the like. The antenna constituting part of the broadcast receiving module 111 (refer to FIG. 1) may be provided in the terminal body in a retractable manner.

A power supply unit 190 (refer to FIG. 11) for supplying power to the mobile terminal 100 may be mounted on the terminal body. The power supply unit 190 may be incorporated into the terminal body, or may include a battery 191 configured in a detachable manner on the outside of the terminal body. According to the drawing, it is illustrated that the battery cover 103 is combined with the rear case 102 to cover the battery 191, thereby restricting the battery 191 from being released and protecting the battery 191 from external shocks and foreign substances.

It will be obvious to those skilled in the art that the technology of the mobile terminal or the wearable device disclosed herein can be specified into other particular forms without departing from the technical scope of the present disclosure.

Hereinafter, description will be given of a vehicle control apparatus having a proximity sensor in accordance with one exemplary embodiment, with reference to FIGS. 14A and 14B.

Figure 14A:
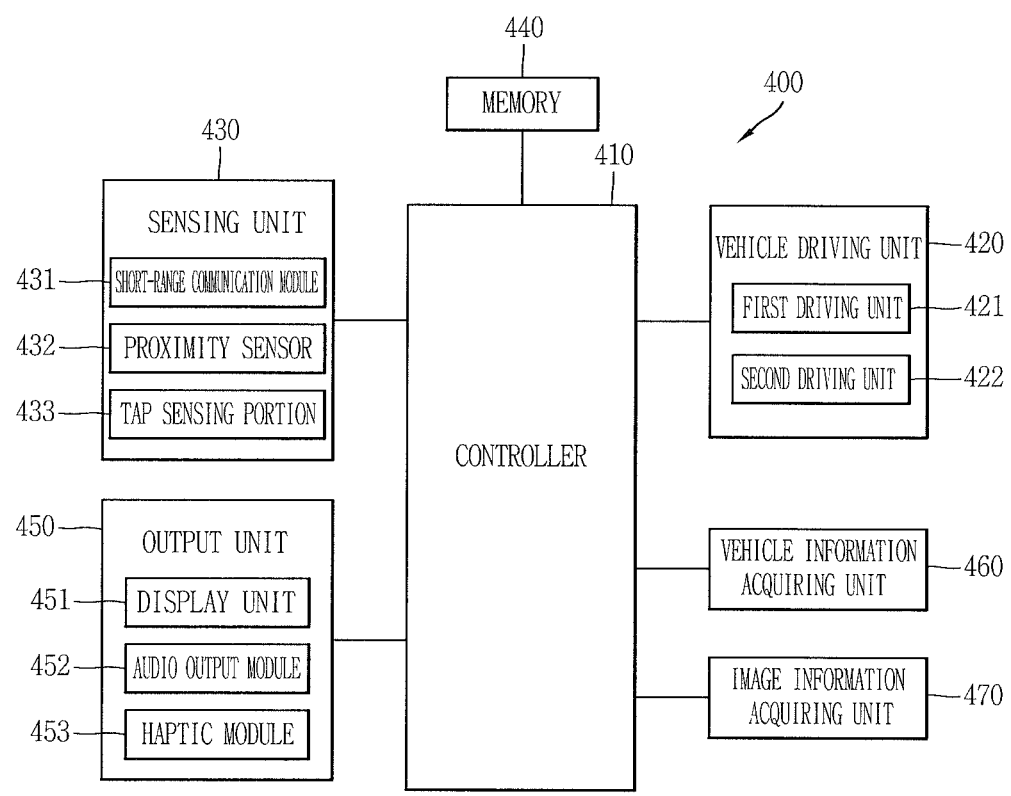
FIG. 14A is a view illustrating a configuration of a vehicle control apparatus having a proximity sensor in accordance with one exemplary embodiment disclosed herein.
Figure 14B:
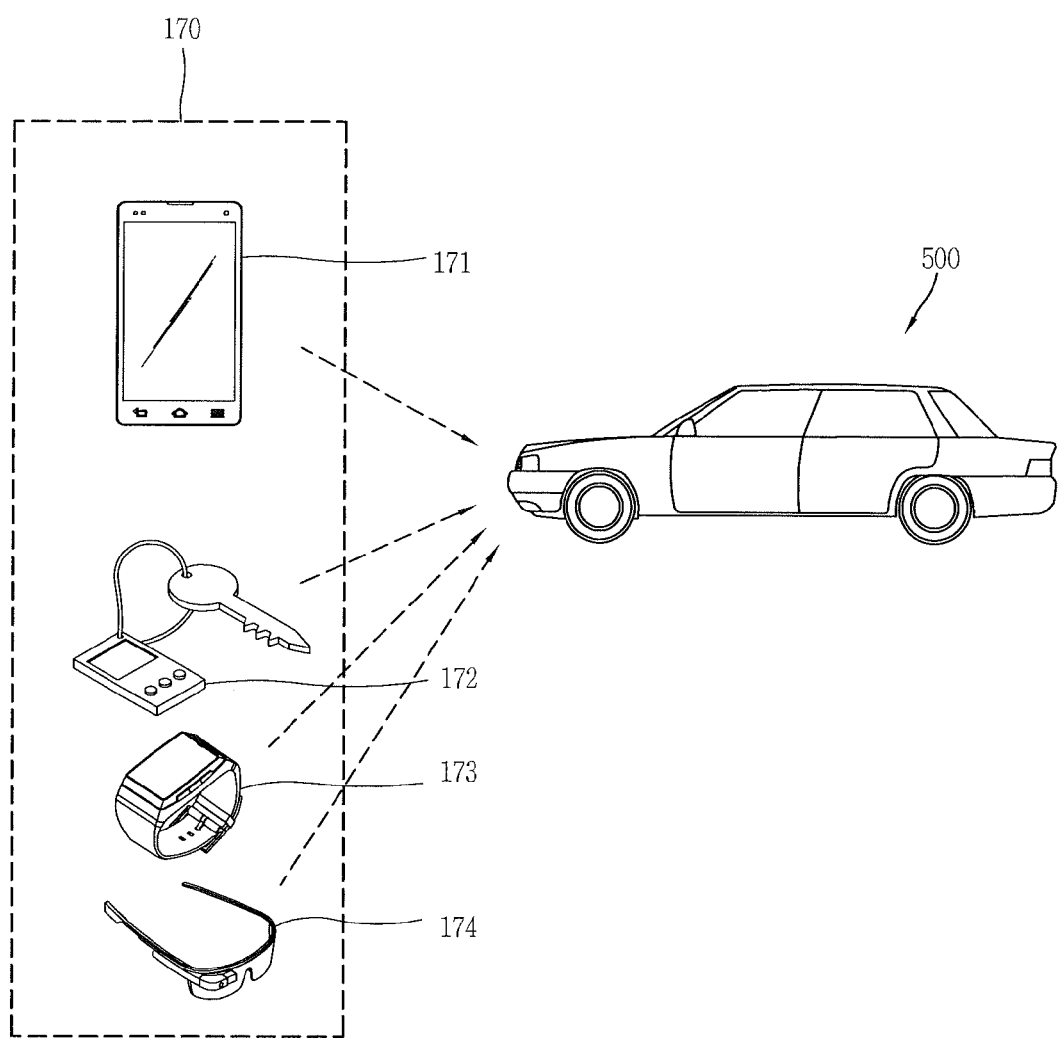
FIG. 14B is an exemplary view illustrating one example of external devices connected to a vehicle control apparatus disclosed herein.

FIG. 14A is a view illustrating a configuration of a vehicle control apparatus having a proximity sensor in accordance with one exemplary embodiment disclosed herein, and FIG. 14B is an exemplary view illustrating one example of external devices connected to a vehicle control apparatus disclosed herein First, a vehicle control apparatus 400 according to one exemplary embodiment disclosed herein, as illustrated in FIG. 14A, may include a controller 410, and a sensing unit 430, a vehicle driving unit 420 and a memory 440 which are all connected to the controller 410. The vehicle control apparatus 400 may further include an output unit 450. The vehicle control apparatus 400 may be provided at a body unit of a vehicle, which includes an outer frame forming appearance of the vehicle and an inner frame formed to allow a user to be on board. It is understood that implementing all of the illustrated components is not a requirement for implementing the vehicle control apparatus 400, and that greater or fewer components may alternatively be implemented.

The sensing unit 430 is typically implemented using one or more sensors configured to sense internal information of the mobile terminal, the surrounding environment of the mobile terminal, user information, and the like. For example, the sensing unit 430 may alternatively or additionally include other types of sensors or devices, such as a proximity sensor 432, an illumination sensor, a touch sensor, an acceleration sensor, a magnetic sensor, a G-sensor, a gyroscope sensor, a motion sensor, an RGB sensor, an infrared (IR) sensor, a finger scan sensor, a ultrasonic sensor, an optical sensor (for example, camera 121), an environment sensor (for example, a barometer, a hygrometer, a thermometer, a radiation detection sensor, a thermal sensor, and a gas sensor, among others), and a chemical sensor (for example, an electronic nose, a health care sensor, a biometric sensor, and the like), to name a few. The vehicle control apparatus 400 disclosed herein may be configured to utilize information obtained from sensing unit 140, and in particular, information obtained from one or more sensors of the sensing unit 140, and combinations thereof.

Meanwhile, the sensing unit 430 may further include a short-range communication module 431. The short-range communication module 431 may support short-range communications using at least one of technologies, such as Bluetooth™, Radio Frequency IDentification (RFID), Infrared Data Association (IrDA), Ultra WideBand (UWB), ZigBee, Near Field Communication (NFC), wireless fidelity (Wi-Fi), Wi-Fi direct, wireless universal serial bus (USB) and the like. The short-range communication module 431 may support wireless communication between the vehicle control apparatus 400 and an external device 170 (see FIG. 14B) through short-range wireless area networks.

The external device may be the aforementioned mobile terminal 100. Specifically, the external device may be a type of wearable device 200, 200' which is one type of the mobile terminal.

The vehicle driving unit 420 may release a lock state of the vehicle or convert the state of the vehicle into the lock state. Here, the locked state of the vehicle is a state where functions of the vehicle are limited entirely or partially, the vehicle does not start, or a door of the vehicle does not open. On the contrary, the released state may mean a state where at least one among a driver's side door, a passenger's side door, rear doors, and a trunk can open, or a state where all functions of the vehicle can be performed, that is, the vehicle can start, or various functions such as a navigation function and a ventilation function can be performed).

The vehicle driving unit 420 may change various settings and enable a function to be automatically performed. The vehicle driving unit 420 may control each component of the vehicle under control of the controller 410. For instance, the vehicle driving unit 420 may control an open degree of a driver's side window or a passenger's side window, an angle of a side mirror, etc. The vehicle driving unit 420 may adjust a height or a horizontal position (for example, a distance between seats) of at least one among a driver's seat or a passenger seat and rear seats. Further, the vehicle driving unit 420 may set a steering wheel on a driver's side. For instance, the vehicle driving unit, for example, may set a height, a sensitivity, etc. of the steering wheel under the control of the controller 410. Further, under control of the controller 410, the vehicle driving unit 420 may enable a gear to operate in an automatic transmission mode or in a manual transmission mode. In case of a hybrid vehicle, the vehicle driving unit 420 may enable either a combustion engine mode or an electric motor mode, to be preferentially selected.

Under control of the controller 410, the vehicle driving unit 420 may change not only a hardware setting state of the vehicle, but also a software setting state of the vehicle. For example, under control of the controller 410, the vehicle driving unit 420 may enable a predetermined music play list to be displayed or may enable one music item on the predetermined music play list to be automatically reproduced. Further, the vehicle driving unit 420 may automatically set a predetermined specific destination point, and may enable a path to the specific destination point to be automatically displayed though a navigation system. In addition, under control of the controller 410, the vehicle driving unit 420 may enable a distance from a preceding or following vehicle or a speed of the vehicle to be automatically set, in a case where a cruse control of the vehicle operates.

To this end, the vehicle driving unit 420 may be provided with one or more different sub-driving units, and the sub-driving units may change hardware or software setting states of the vehicle, respectively. The sub-driving unit configured to change a hardware setting state of the vehicle is referred to as a first driving unit 421, and the sub-driving unit configured to change a software setting state of the vehicle is referred to as a second driving unit 422.

Here, in order to change a hardware setting of the vehicle, the first driving unit 421 may include other components for changing the external frame or the internal frame of the vehicle. For example, the first driving unit 421 may further include a hardware driving unit for adjusting a height of a seat or an angle of a back of a seat. And, the first driving unit 421 may further include an adjusting unit for adjusting a height of a steering wheel. The adjusting unit includes an elastic member such as a coil or a spring, or a pressure member.

Meanwhile, the second driving unit 422 may be implemented as one or more application programs or applications. For example, the second driving unit 422 may be implemented as a form that includes one of application programs for driving a navigation system, or that includes an application program for reproducing pre-stored media data (for example, MP3) and the like. Such application programs or applications may be one of various types of vehicle control apparatuses.

The output unit 450 is configured to provide outputs in a visual, audible, and/or tactile manner (e.g., audio signal, video signal, alarm signal, vibration signal, etc.). The output unit 450 may include at least one of a display unit 451, an audio output module 452, a haptic module 453 and an optical output module 454. The display unit 451 displaying various types of image information may be layered or integrated with a touch sensor, so as to implement a touch screen. The touch screen may function as the user input unit 423 providing an input interface between the vehicle control apparatus 400 and a user and simultaneously provide an output interface between the vehicle control apparatus 400 and the user.

The touch screen may be implemented on various portions of the vehicle. For example, the touch screen may be implemented on an entire region or a partial region of a windshield of the vehicle. Alternatively, the touch screen may be implemented anywhere on an external surface (a surface exposed to outside of the vehicle) or an internal surface (a surface that faces inside of the vehicle). The touch screen may be also implemented on an external or internal surface of a driver's side window, a passenger's side window, or windows on the rear seat side of the vehicle. The touch screen may be also implemented on a side mirror or a sunroof of the vehicle.

The touch screen may be implemented not only on glass such as a window or a sunroof of the vehicle, but also on the external or internal frame of the vehicle. For example, the touch screen may be implemented on a surface of the external frame of the vehicle, that is, between a windshield and a window or between windows, such as a A-pillar, a B-pillar or a C-pillar. Alternatively, the touch screen may be implemented on at least one portion (for example, one portion in the vicinity of a door knob of a vehicle door) of an external surface of the vehicle door. The touch screen may be also formed on a surface of a cover of a gear box within the vehicle or on one portion of a cover of a console box. In addition, the touch screen may be formed in plurality on one or more different portions of the vehicle.

A memory 440 stores therein data available to various functions of the vehicle control apparatus 400. The memory 440 may store therein multiple application programs or applications that are driven in the vehicle control apparatus 400, data and commands for an operation of the vehicle control apparatus 400. At least part of such application programs may be downloaded from an external server through wireless communication. For basic functions of the vehicle control apparatus 400 (for example, a vehicle starting function, a navigation function, and vehicle locking and unlocking functions), at least part of such application programs may be pre-installed on the vehicle control apparatus 400 before being released. On the other hand, the application program may be stored in the memory 440, and may be installed on the vehicle control apparatus 100. The controller 410 may run the application program so that an operation (or a function) of the vehicle control apparatus can be performed.

According to one embodiment, the application program may be a navigation program for performing the navigation function.

In addition, the memory 440 may store information related to at least one user. Here, information on at least one user may be stored in the memory 440. The information on the user may be authentication information on the user, and information on various types of setting conditions of the vehicle that are set by the user himself/herself or are set properly based on bio-information on the user. The information on the user is, for example, setting information on temperature or humidity in the vehicle which is set by the user himself/herself, setting information that depends on a driving habit of the user, or the like. In addition, the information on the user may be a record of driving paths along which the user drove. In addition, the authentication information may be information on a password or a pattern that is predetermined by the user, or may be information that is based on bio-information on the user, such as recognition information on user's fingerprints or irises. In addition, the authentication information may be information relating to a user's gesture.

According to one embodiment, the user's bio-information may be acquired by the mobile terminal 100.

Here, the wearable device may further a communication unit that is configured to perform communication with the vehicle control apparatus installed in the vehicle, and a bio-information acquiring unit that is configured to acquire user-related bio-information from a specific body portion (for example, a wrist portion).

Here, the communication unit may transmit the acquired user bio-information to the vehicle control apparatus 400, and the memory 440 may store the user bio-information.

The bio-information may be information related to at least one of heart beat rate, body fat, blood pressure, blood sugar, facial shape, fingerprints, brain waves and irises.

Also, the memory 440 may store programs for operations of the controller 410, and temporarily store input/output data (for example, user authentication information and driving environment setting information). The memory 440 may store data associated with vibration and sounds of various patterns which are output in response to a touch input applied to the touch screen.

The memory 440 may include one or more types of storage mediums including a flash memory type, a hard disk type, a solid state disk (SSD) type, a silicon disk drive (SDD) type, a multimedia card micro type, a card-type memory (e.g., SD or DX memory, etc), a Random Access Memory (RAM), a Static Random Access Memory (SRAM), a Read-Only Memory (ROM), an Electrically Erasable Programmable Read-Only Memory (EEPROM), a Programmable Read-Only memory (PROM), a magnetic memory, a magnetic disk, an optical disk, and the like. The vehicle control apparatus 400 may also be operated in relation to a network storage device that performs the storage function of the memory 170 over a network, such as the Internet.

Meanwhile, the controller 410 typically controls the general operations of the vehicle control apparatus 400 in addition to the operations associated with the application programs. The controller 410 may control an operation of the vehicle by processing signals, data, information and the like input or output through those components, or running the application programs stored in the memory 440. Also, the controller 410 may control at least parts of the components illustrated in FIG. 11 for running the application programs stored in the memory 440. The controller 410 may operate at least two of those components included in the vehicle control apparatus 400 in a combined manner for running the application program.

The controller may receive authentication information input by a user, and determine whether or not the user is an authenticated user based on the input authentication information. Here, the authentication information may be scan information related to a user's fingerprint, or a preset pattern. Or, the authentication information may be user iris scan information or information related to a user's specific gesture. For example, the controller 410 may receive pattern recognition information or finger recognition information, as the authentication information. The pattern recognition information is on multiple-time tapping (for example, multiple taps or multiple knocks) that are applied by a user to one portion of an external or internal surface of the vehicle. The finger recognition information is input through one portion of the external or internal surface of the vehicle, or through a touch screen region that is formed on a driver's side or passenger's side window, a window shield and the like. In addition, the controller 410 may recognize a user's gesture that is formed inside or outside the vehicle, or may recognize information on a user's irises, using a photo sensor or a camera that is provided in the sensing unit 430.

The controller 410 may release a locked state of the vehicle only when a user is an authenticated user. Thus, the vehicle control apparatus 400 enables the user to open a door of the vehicle, a trunk, and the like without having to use a key. In addition, the controller 410 may make the vehicle start using predetermined authentication information on the user. In addition, the controller 410 may switch the current state of the vehicle into the locked state. That is, based on selection by the authenticated user, the controller 410 may maintain the locked state of the vehicle until the authentication information on the authenticated user is input again. On the other hand, when the authentication information on the user is input from outside of the vehicle in the state where the vehicle has been unlocked, the controller 410 switches the state of the vehicle to the locked state. Then, when the same authentication information is input again in a state where the vehicle has been switched to the locked state, the vehicle may be switched back to the unlocked state.

The controller 410 may form a touch screen on one portion of the vehicle such that the authentication information on the user is input. The controller 410 may receive information on a user's fingerprint or pattern information through the touch screen. Alternatively, the controller 410 may receive a preset password. To do this, the controller 410 may perform pattern recognition processing that recognizes a writing input or a picture-drawing input that is applied onto the touch screen, as a text or an image, respectively. Furthermore, the controller 410 may control one or more of the above components by combination, in order to realize various embodiments of the vehicle control apparatus 400 which are to be described below.

In addition, the controller 410 may display various pieces of image information on the touch screen that is formed on one portion of the vehicle. For example, the controller 410 may display a finger input region for user authentication or graphic objects for a pattern input on the touch screen, and may display a result of the user authentication, information on a currently-authenticated user, or the like.

When a user is an authenticated user, the controller 410 may change a setting state of the vehicle based on information on the corresponding user. For example, the controller 410 may adjust a height of a driver's seat or the like, an angle of a back of a seat, or the like, and may adjust temperature or humidity in the vehicle, by controlling a first driving unit 421, based on information on the authenticated user. In addition, based on information on the authenticated user, the controller 410 may adjust an open degree of a driver's side window or a passenger's side window, an angle of a side mirror, a height of a steering wheel, etc.

The controller 410 may change various types of operation modes of the vehicle according to an authenticated user. For example, the controller 410 may control one operation mode preferred by an authenticated user (e.g., a normal mode or a sports mode) to be selected, by switching an operation mode of a power steering device of a steering wheel. In addition, the controller 410 may switch a gear transmission mode to a manual transmission mode or an automatic transmission mode according to a preference of an authenticated user.

In addition, the controller 410 may change not only such hardware settings, but also software settings. For example, if an authenticated user rides in the vehicle, the controller 410 automatically selects his/her favorite music item or a list containing a music item that he/she previously listens to. In addition, the controller 410 may automatically select a channel of a radio broadcasting system that the authenticated user frequently tunes in and listens to.

In addition, the controller 410 may change various settings of the vehicle, based on a time at which the authenticated user rides in the vehicle. For example, based on a time at which the user is authenticated and on a record of the authenticated driver's driving, the controller 410 may search for a destination point where the authenticated user frequently goes at the corresponding time. That is, in a case where the user has a habit of regularly going "home" after work between 8:00 pm and 9:00 pm, if the user rides in the vehicle between 8:00 pm to 9:00 pm, the controller 410 may automatically set the destination point to "home" and display the corresponding path on a display unit of a navigation system, based on the record of the driving.

In this manner, the controller 410 of the vehicle control apparatus 40 according to the embodiment of the present invention enables the user to control the vehicle using the authentication information. As a result, the user can ride in the vehicle and control the vehicle in an easier and more convenient manner. When the user is authenticated, the controller 410 of the vehicle control apparatus 400 according to the embodiment of the present invention adjusts various driving environment settings of the vehicle as well, based on the fact that the user is authenticated, thereby automatically providing his/her favorite driving environment.

In addition, regardless of whether or not the user rides in the vehicle, the controller 410 may change the hardware or software settings of the vehicle in a convenient manner, based on the user's selection. For example, the controller 410 may change at least one hardware or software setting, based on the multiple-times tapping on the inside of the vehicle, for example, the console box, the gear box, or the windows in the driver seat or the front passenger seat. As one example, if the user applies the tapping multiple times to the steering wheel of the vehicle, the controller 410 recognizes this and thus may adjust the height of the steering wheel or may change the power steering wheel operation mode from one mode to another.

On the other hand, the controller 410 changes the hardware or software setting state, based not only on the multiple taps, but also on the user's gesture. For example, the controller 410 makes it possible for a camera, a photo sensor, a laser sensor, or an infrared sensor to sense movements of the driver or the passenger who rides in the vehicle. Then, based on the movements of the driver and the passenger, the controller 410 may perform a specific function and adjust a currently-set state. As one example, if the passenger sitting on the front passenger seat make a hand-lowering gesture toward the window in the front passenger seat, the extent to which the window in the front passenger seat is opened is adjusted based on the passenger's gesture. In addition, if a specific gesture (for example, a fingers-flicking gesture or a hands-clapping gesture) is sensed, the controller 110 may reproduce predetermined specific music data, based on the driver's or passenger's gesture.

On the other hand, at least one or more among the constituent elements described above, operate in cooperation with one another to realize operation or control of the vehicle control apparatus 400, or a method of controlling the vehicle control apparatus 400, which are described above, according to various embodiments. In addition, the operation or the control of the vehicle control apparatus 100, or the method of controlling the vehicle control apparatus 400 is realized on the vehicle control apparatus 400 by running at least one application program that is stored in the memory 440.

Hereinafter, each of those components will be described in more detail, with reference to FIG. 14A.

The sensing unit 430 sense at least one of internal information related to the vehicle control apparatus 400, surrounding environment information of the vehicle control apparatus 400 and user information, and then generates a sensing signal corresponding to the sensed information. The controller 410 may control an activation or operation of the vehicle control apparatus 400, or execute data processing, a function or an operation associated with an application program installed in the vehicle control apparatus 400 based on the sensing signal. Examples of representative sensors which may be included in the sensing unit 430 will be described in more detail.

First, the proximity sensor 432 refers to a sensor to sense presence or absence of an object approaching to a surface to be sensed, or an object disposed near a surface to be sensed, by using an electromagnetic field or infrared rays without a mechanical contact. The proximity sensor 432 may be disposed on each area of inside or outside of the vehicle or near the touch screen.

The proximity sensor 432 may include a transmissive type photoelectric sensor, a direct reflective type photoelectric sensor, a mirror reflective type photoelectric sensor, a high-frequency oscillation proximity sensor, a capacitance type proximity sensor, a magnetic type proximity sensor, an infrared rays proximity sensor, and so on. When the touch screen is implemented as a capacitance type, proximity of a pointer to the touch screen may be sensed by changes of an electromagnetic field. In this case, the touch screen (touch sensor) may be categorized into a proximity sensor.

Hereinafter, for the sake of brief explanation, a status that the pointer is positioned to be proximate onto the touch screen without contact will be referred to as 'proximity touch', whereas a status that the pointer substantially comes in contact with the touch screen will be referred to as 'contact touch'. For the position corresponding to the proximity touch of the pointer on the touch screen, such position will correspond to a position where the pointer faces perpendicular to the touch screen upon the proximity touch of the pointer. The proximity sensor 432 may sense proximity touch, and proximity touch patterns (e.g., distance, direction, speed, time, position, moving status, etc.). Meanwhile, the controller 410 may process data (or information) corresponding to the proximity touch operation and the proximity touch pattern sensed by the proximity sensor 432. Information relating to the sensed proximity touch and the sensed proximity touch patterns may be output onto the touch screen. The controller 410 may control the vehicle control apparatus 400 to process different operations or data (or information), based on whether the touch applied to the same point on the touch screen is either a proximity touch or a contact touch.

The details of the proximity touch 432 will be understood by the foregoing description, so it may not be described again in detail.

The touch sensor senses a touch (or touch input) applied to the touch screen (or the display unit 451) using any of a variety of touch methods. Examples of such touch methods include a resistive type, a capacitive type, an infrared type, and a magnetic field type, among others.

As one example, the touch sensor may be configured to convert changes of pressure applied to a specific part of the display unit 451, or convert capacitance occurring at a specific part of the display unit 451, into electric input signals. The touch sensor may also be configured to sense not only a touched position and a touched area, but also touch pressure and/or touch capacitance. A touch object is generally used to apply a touch input to the touch sensor. Examples of typical touch objects include a finger, a touch pen, a stylus pen, a pointer, or the like.

When a touch input is sensed by a touch sensor, corresponding signals may be transmitted to a touch controller. The touch controller may process the received signals, and then transmit corresponding data to the controller 410. Accordingly, the controller 410 may sense which region of the display unit 451 has been touched. Here, the touch controller may be a component separate from the controller 410, the controller 410, and combinations thereof.

In some embodiments, the controller 410 may execute the same or different controls according to a type of touch object that touches the touch screen or a touch key provided in addition to the touch screen. Whether to execute the same or different control according to the object which provides a touch input may be decided based on a current operating state of the vehicle control apparatus 400 or a currently executed application program, for example.

The touch sensor and the proximity sensor may be implemented individually, or in combination, to sense various types of touches. Such touches includes a short (or tap) touch, a long touch, a multi-touch, a drag touch, a flick touch, a pinch-in touch, a pinch-out touch, a swipe touch, a hovering touch, and the like.

If desired, an ultrasonic sensor may be implemented to recognize position information relating to a touch object using ultrasonic waves. The controller 410, for example, may calculate a position of a wave generation source based on information sensed by an illumination sensor and a plurality of ultrasonic sensors. Since light is much faster than ultrasonic waves, the time for which the light reaches the optical sensor is much shorter than the time for which the ultrasonic wave reaches the ultrasonic sensor. The position of the wave generation source may be calculated using this fact. For instance, the position of the wave generation source may be calculated using the time difference from the time that the ultrasonic wave reaches the sensor based on the light as a reference signal.

Meanwhile, the sensing unit 430 may include at least one a camera sensor (CCD, CMOS etc.), a photo sensor (or image sensors), and a laser sensor for recognizing a user gesture.

Implementing the camera 421 with a laser sensor may allow detection of a touch of a physical object with respect to a 3D stereoscopic image. The photo sensor may be laminated on, or overlapped with, the display device. The photo sensor may be configured to scan movement of the physical object in proximity to the touch screen. In more detail, the photo sensor may include photo diodes and transistors at rows and columns to scan content received at the photo sensor using an electrical signal which changes according to the quantity of applied light. Namely, the photo sensor may calculate the coordinates of the physical object according to variation of light to thus obtain position information of the physical object.

As described above, various pieces of image information relating to inputting of the authentication information on the user are displayed on the display unit 451. For example, a graphic object that indicates a region for inputting a user's fingerprint or a graphic object for inputting the pattern information are displayed on the display unit 451 that is formed, as the touch screen, on one portion of the vehicle. In addition, if user authentication is ended, a result of the user authentication and information relating to the currently-authenticated user may be displayed on the display unit 451. These pieces of image information are displayed on at least one portion of the windshield of the vehicle, the window in the front passenger seat, or the like. To do this, at least one portion of the window of the vehicle or at least one portion of the windshield of the vehicle that is equipped with the vehicle control apparatus 400 according to the embodiment of the present invention is designed in such a manner that the touch input by the user is sensed.

In addition, the display unit 451 is formed on not only the external surface of the windshields and of the window, but also on the internal surface. Then, information that is processed in the vehicle control apparatus 400 may be displayed (or output) on the display unit 451 that is formed on the internal surface.

For example, screen information that is displayed on the display unit 451 that is formed on the internal surface is execution screen information on an application program that is run on the vehicle control apparatus 400, or information on a user interface (UI) and a graphic user interface (GUI) that depend on the execution screen information.

In addition, the display unit 451 may be realized as included in the sensing unit 430. In this case, a result of the sensing by the sensing unit 430, and a result of matching the user authentication information or at least one portion (for example, a name of the user and like) of the authentication information inherent to the user may be displayed on the display unit 451.

The audio output module 452 may output audio data stored in the memory 440. The audio output module 452 outputs an audio signal associated with a function (for example, a user authentication confirmation sound, a user authentication guiding sound, etc.) executed on the vehicle control apparatus 400. The audio output module 452 may include a speaker, a buzzer and the like.

On the other hand, the output unit 450 of the vehicle control apparatus 400, disclosed in the present specification, according to the embodiment, is configured to include the haptic module 453. The haptic module 453 generates various haptic effects that the user can feel. A typical example of the haptic effect that is generated by the haptic module 453 is vibration. If it is sensed that the touch input by the user is applied to the touch screen realized on the external frame of the internal frame of the vehicle, the widow in the form of glass, or the like, the controller 410 outputs haptic information using the haptic module 453. Accordingly, using the haptic information, the user can confirm whether he/she properly input the authentication information.

The strength, pattern and the like of the vibration generated by the haptic module 453 can be controlled by user selection or setting by the controller. For example, the haptic module 453 may output different vibrations in a combining manner or a sequential manner.

Besides vibration, the haptic module 453 can generate various other tactile effects, including an effect by stimulation such as a pin arrangement vertically moving to contact skin, a spray force or suction force of air through a jet orifice or a suction opening, a touch to the skin, a contact of an electrode, electrostatic force, an effect by reproducing the sense of cold and warmth using an element that can absorb or generate heat, and the like.

The haptic module 453 can also be implemented to allow the user to feel a tactile effect through a muscle sensation such as the user's fingers or arm, as well as transferring the tactile effect through direct contact. Two or more haptic modules 453 may be provided according to the particular configuration of the vehicle control apparatus 400.

Various embodiments described herein may be implemented in a computer-readable medium, a machine-readable medium, or similar medium using, for example, software, hardware, or any combination thereof.

On the other hand, the sensing unit 430 of the vehicle control apparatus 400, disclosed in the present specification, according to the embodiment may further include a main body that is configured to be mounted on the body and to come into contact with one portion of a user's body, and a tap sensing unit 433 for sensing a tap on the main body or a tap gesture. At this point, the tap that is sensed in the tap sensing unit 433 of the vehicle control apparatus 400 is a means for inputting the authentication information on the user. In addition, if the user rides in the vehicle, the tap is used as a means for controlling various functions of the vehicle control apparatus 400. Then, the tap is construed to mean a motion of lightly hitting the main body of the vehicle control apparatus 400 or an object, with a tapping tool such as a finger, or a motion of lightly bringing the tapping tool into contact with the main body of the vehicle control apparatus 400 or the object. At this point, the main body of the sensing unit 430 is formed on a body unit of the vehicle that is configured to include the external frame and the internal frame of the vehicle and the window or the windshield.

On the other hand, the tapping tool with which the tap is applied is a thing that applies an external force to the main body of the vehicle control apparatus 400 or the object, such as a finger, a stylus pen, a pen, a pointer, and a fist. On the other hand, the tapping tool is not necessarily limited to the thing that can apply the external force to the vehicle control apparatus 400 according to the present invention, and any type of thing may be possible as long as it can apply the external force to the main body of the vehicle control apparatus 400 or the object.

The object to which the tap gesture is applied may include at least one of the main body of the vehicle control apparatus 400 and an object placed on the vehicle control apparatus 400.

On the other hand, the tap or the tap gesture is sensed by at least one among an acceleration sensor and a touch sensor that are included in the tap sensing unit 433. At this point, the acceleration sensor is a sensor that is capable of measuring dynamic forces, such as acceleration, vibration, and impact, which are applied to the main body of the vehicle control apparatus 400.

That is, the acceleration sensor senses vibration (or a movement) of the main body of the vehicle control apparatus 400, which occurs due to the tap gesture, and thus senses whether the tap is applied to the object. Therefore, the acceleration sensor senses the tap on the main body of the vehicle control apparatus 400 or senses that an object that is positioned close to the main body of the vehicle control apparatus 400 to such an extent that it can be sensed whether the movement or the vibration occurs in the main body of the vehicle control apparatus 400 is tapped on.

In this manner, as long as the sensing of the movement or the vibration of the main body of the vehicle control apparatus 100 is possible, the acceleration sensor senses not only the application of the tap to the main body of the vehicle control apparatus 100, but also senses the application of the tap to points other than the main body.

To sense a tap applied to the main body of the vehicle control apparatus 400, the vehicle control apparatus 400 may use one of the acceleration sensor and the touch sensor, sequentially use the acceleration sensor and the touch sensor or simultaneously use both of the acceleration sensor and the touch sensor. To sense the tap, a mode using only the acceleration sensor may be referred to as a first mode, a mode using only the touch sensor may be referred to as a second mode, and a mode using both of the acceleration sensor and the touch sensor (simultaneously or sequentially) may be referred to as a third mode or a hybrid mode. When a tap is sensed by the touch sensor, a position where the tap is sensed can be recognized more accurately.

Meanwhile, the mobile terminal according to an embodiment of the present invention may operate in a specific mode in which minimum electric current or power is consumed even when the display unit 451 of the vehicle control apparatus 400 is in a deactivated state in order to sense the tap through the acceleration sensor or touch sensor. The specific mode is referred to as a "doze mode."

For example, the doze mode may be a mode in which only a light emitting diode for outputting a screen to the display unit 151 is turned off, and the touch sensor may be maintained in an on-state, in a touch screen structure in which the touch sensor and the display unit 451 form a mutual layer structure. Alternatively, the doze mode may be a mode in which the display unit 451 is turned off and the acceleration sensor is maintained in an on-state. Alternatively, the doze mode may be a mode in which the display unit 451 is turned off and both of the touch sensor and the acceleration sensor are maintained in an on-state.

Accordingly, in the doze mode, that is, when the display unit 451 is turned off (i.e., the display unit 451 is inactivated), and when a user applies the tap to at least one point on the display unit 451 or a specific point of the main body of the vehicle control apparatus 400, at least one of the touch sensor and the acceleration sensor, which is turned on, can sense that the tap has been applied by the user.

In addition, in order to distinguish between a tap as a means for inputting the authentication information on the user or a tap as a means for controlling a function of the vehicle control apparatus 400, and a simple collision of an outside arbitrary object with the touch screen, only if the tap is applied two or more times within a reference time to the touch screen formed on one portion of the vehicle, it is determined that the "tap" is sensed for inputting the authentication information on the user and controlling the vehicle control apparatus 400. For example, if it is determined that as a result of the sensing by the tap sensing unit 133, the tap is applied one time to the touch screen formed on one portion of the vehicle, the controller 110 may recognize that only the outside arbitrary object or an human body collides with the touch screen, without recognizing that the one-time tap is for inputting the authentication information on the user.

Accordingly, the controller 410 can determine that "tap for inputting the user authentication information or controlling one or more functions of the vehicle control apparatus 400 has been sensed only when two or more (or a plurality of) consecutive taps are sensed in a reference time.

That is, the tap gestures mean that the tap gesture is to be sensed at least two times consecutively within the reference time. Therefore, the sensing of the "tap" hereinafter means that it is sensed that a user's finger or an object such as a touch pen is lightly hit substantially multiple times on the main body of the main body of the vehicle control apparatus 400.

Furthermore, the controller 410 may make it possible not only to sense the tap within the reference time, but also to determine whether the taps applied using user's different fingers are sensed or the taps applied using one finger of the user's are sensed. For example, if it is sensed that the taps are applied to one predetermined portion of the vehicle, that is, one portion of the window of the vehicle or one portion of the window shield, an A-pillar, a B-pillar, a C-pillar, a sunroof, one portion of a vehicle door, or a console box or a gear box in the vehicle, the controller 410 makes it possible to sense whether the taps are applied using one finger or using different fingers, using fingerprints that are sensed from the portion to which the taps are applied. In addition, the controller 410 recognizes a position on the display unit 451, at which the taps are sensed, or acceleration that is generated due the taps, through at least one, among the touch sensor and the acceleration sensor that are provided in the tap sensing unit 433. Thus, the controller 410 makes it possible to sense whether the taps are applied using one finger or using different fingers.

Furthermore, considering additionally an angle at which the tap is applied and a distance between points to which the tap is applied or a direction in which the fingerprint is recognized, the controller 410 determines whether the taps are applied using one finger or using both hands or at least two fingers.

The taps may mean a plurality of hits that are sensed consecutively in a reference time. Here, the reference time may be a very short time, for example 300 ms to 2 sec.

To do this, when the tap sensing unit 433 senses that the main body of the vehicle control apparatus 400 is tapped on, the tap sensing unit 433 senses whether the next tapping is applied consecutively within the reference time after the first tapping is sensed. Then, if the next tapping is sensed within the reference time, the tap sensing unit 433 or the controller 410 determines that the tap is sensed for inputting the authentication information on the user or for controlling a specific function of the vehicle control apparatus 400 according to the embodiment of the present invention. In this manner, only if a second tap is sensed within a predetermined time after a first tap is sensed, the controller 410 recognizes the first and second taps as "effective taps." Thus, the controller distinguishes between the tap that is applied to input the authentication information on the user or to control the vehicle control apparatus 400 and the collision of an object with the inside or outside of the vehicle, which occurs unintentionally or due to a user's mistake.

There are various methods of recognizing the "effective tap." For example, when it is sensed that the second tap is applied a second reference number of times or greater to the main body within a predetermined time after sensing the first tap that is applied a first reference number of times or greater, the controller 410 may recognizes the first and second taps as the "effective taps." At this point, the first reference number of times and the second reference number of times may be the same or be different. For example, the first reference number of times may be 1, and the second reference number of times may be 2. As another example, the first reference number of times and the second reference number of times may be all 1.

In addition, only if the tap is applied to within a "predetermined region," it is determined that the "taps" are sensed. That is, when it is determined that the main body of the vehicle control apparatus 400 is first tapped on, the controller 410 calculates a predetermined region from a point at which the tapping is first sensed. Then, if the tapping is consecutively sensed the first or second reference number of times or greater at the "predetermined region" within the reference time after the first tapping is sensed, the controller 410 determines that the first tap or the second tap is applied.

On the other hand, of course, the reference time and the predetermined region that are described above can be variably modified according to the embodiment.

On the other hand, of course, the first tap and the second tap may be sensed as a separate tap according to not only the reference time and the predetermined region, but also a position at which each tap is sensed. That is, if the second tap is sensed in a position that is a predetermined distance or above away from the position in which the first tap is sensed. The controller 410 determines that the first tap and the second tap are applied. Then, if the first tap and the second tap are recognized based the position in which the tap is sensed, the first tap and the second tap may be sensed at the same time.

In addition, if the first tap and the second tap are configured from multiple touches, that is, from multiple-times tapping, of course, the multiple touches that make up each of the first tap and the second tap are sensed at the same time. For example, if the first touch that makes up the first tap is sensed and at the same time, the first touch that makes up the second tap is sensed in a position that is a predetermined distance or above from a position in which the first touch that makes up the first tap is sensed, the controller 410 makes it possible to enable the first touch that makes up each of the first tap and the second tap. Then, the controller 410 makes it possible to enable an additional touch input, which is sensed in each position. If the touch is sensed the first reference number of times or greater or the second reference number of times or greater, the controller 410 determines that the first tap and the second tap are applied.

On the other hand, when the tap sensing unit 433 senses multiple times that the tap is applied to the main body of the vehicle control apparatus 400, the controller 4110 controls not only the user authentication, but also at least one among functions that is executable on the vehicle control apparatus 400. At this point, the functions that are executable on the vehicle control apparatus 400 means all types of functions that is executable or be runnable on the vehicle control apparatus 400. At this point, one among the executable functions is a function of an application that is installed on the vehicle control apparatus 400. Then, "an arbitrary function is executed" means "an arbitrary application program is executed or is run on the vehicle control apparatus 400." For example, based on the user's multiple taps that are sensed in the console box, the controller 410 reproduces a music file or controls the navigation apparatus in such a manner that a path to a predetermined destination point is automatically set.

As another example, a function that is executable in the vehicle control apparatus 100 is a function that is necessary for basic driving of the vehicle control apparatus 100. For example, the function necessary for the basic driving is a function of turning on/off an air conditioner or a warm-air circulator provided in the vehicle, a function of starting the vehicle, a function of switching between the locked state and the unlocked state, or the like. In addition, the function necessary for the basic driving is a function of turning a cruise control function of the vehicle on or off.

On the other hand, the controller 410 forms a position for inputting the authentication information on the user, based on a point on the main body or the touch screen at which the tapping by the user is sensed. For example, the controller 410 forms a region for inputting the pattern information, or forms a region for inputting the bio-information on the user, for example, the user's fingerprint, in such a manner that the point at which the tapping by the user is first applied serves the center of the region for inputting the pattern information or the bio-information. In this case, even though the user applies the tap to a different point on the main body or the touch screen each time he/she applies the tap, the point at which the information on the user-set pattern or the bio-information on the user varies each time the user applies the tap. Accordingly, the user can minimize exposure of the authentication information, and this is a safeguard against an illegal act, such as when the vehicle is stolen.

Of course, the user authentication information may be also input into the vehicle control apparatus 400 through an external device that is predetermined based on the user's selection. For example, the sensing unit 430 is connected to a predetermined external device outside of the vehicle using a short-range communication module 431. The authentication information on the user may be input into the sensing unit 430 through the short-range communication module 431 and may be authenticated by the controller 410.

The vehicle control apparatus 400 may acquire vehicle information from the vehicle.

In one example, the vehicle information may be acquired through the sensing unit 430.

As another example, the vehicle control apparatus 400 may separately include a vehicle information acquiring unit 460 for acquiring the vehicle information.

Here, the vehicle information may be information related to at least one of an air conditioning of the vehicle, opening or closing of a door (a hood, a trunk, an oil hole, etc.), a window or a sunroof, a battery charging state of the vehicle, a parked position of the vehicle, a navigation function installed in the vehicle, a stolen state of the vehicle and an oil-fed state of the vehicle.

The vehicle information may further include information related to at least one of a driving speed of the vehicle, acceleration, a currently-driven distance, a number of times for burst of speed, and the number of time for sudden braking.

To this end, the vehicle information acquiring unit 460 may execute communication with various sensors provided in the vehicle.

For example, the vehicle information acquiring unit 460 may be installed in the vehicle and execute communication an acceleration sensor for measuring acceleration of the vehicle so as to collect acceleration information related to the vehicle.

As another example, the vehicle information acquiring unit 460 may execute communication a black box installed in the vehicle to acquire accident images when an accident occurs. Here, the accident images may be stored in the memory 440.

An image information acquiring unit 470 acquire image information related to a user from an image acquiring apparatus.

The image acquiring apparatus is a means for processing image frames of still images or videos which are obtained by image sensors, such as a camera or the like. The image acquiring apparatus obtains user-related images.

The image acquiring apparatus may be one or in plurality, and the image information acquiring unit 470 may acquire image information from the image acquiring apparatus through various communication elements.

FIG. 14B is an exemplary view illustrating one example of external devices connected to a vehicle control apparatus disclosed herein.

As illustrated in FIG. 14B, the predetermined external device 170 is a mobile terminal, such a phone 171 or a smart key 172 that is carried by the user. In this case, the controller 110 recognizes a serial number of the external device 170. If the external device 170 is positioned within a given distance from the controller 110, the controller 410 automatically recognizes a specific user. Then, the controller 110 receives the authentication information that is input through the external device 170. The authentication information that is input from the external device 170 is transferred to the vehicle control apparatus 400 through a communication module provided in the external device 170 and through the short-range communication module 431 of the sensing unit 430.

The authentication information may be bio-information related to the user.

For example, the bio-information may be acquired by the mobile terminal 100 or the wearable device 200.

Here, the bio-information may be at least one of heart beat rate, body fat, blood pressure, blood sugar, facial shape, fingerprints, brain waves and irises.

For example, the authentication information may be recognition information related to heart beat rate, fingerprints or irises of the user, or information related to a preset password or pattern. The authentication information may also be information related to a specific gesture of the user.

The user authentication may be carried out based on a plurality of bio-information or a plurality of authentication information.

For example, the user authentication may be carried out by checking all of the user's heart beat rate and the user gestures.

To do this, the external device 170 may additionally have a configuration for the user inputting the authentication information, that is, a configuration for executing the same functions as those of at least one or more among the sensors provided in the sensing unit 430 of the vehicle control apparatus 400 according to one embodiment or the same functions as those of additional sensors.

For example, the external device 170, such as the smart key 172 or the smart phone 171, may further include a sensing unit that corresponds to a touch screen into which a user can input pattern information, or the tap sensing unit 433 which is provided in the sensing unit 430 of the vehicle control apparatus 400. In addition, the external device 170 may further include a fingerprint recognition unit for recognizing the user's fingerprints. Of course, the external device 170 may further include an inertial sensor, a gyro sensor, an acceleration sensor, or the like.

For example, a smart watch 173 as a watch type mobile terminal may include a sensor for acquiring the user's heart beat rate, and a smart glass 174 as a glass type mobile terminal may include an iris recognition camera for recognizing the user's irises.

In this case, a user may input authentication information on him/her using at least one piece of information among the information on the fingerprints, the predetermined pattern information, and the iris recognition information. In addition, the user may input the authentication information on him/her into the external device 170 by making a specific gesture while wearing the external device 170. In this case, according to the user's gesture, the controller 410 of the external device 170 recognizes the user's gesture using information on a change in a position of the external device 170, that is, an acceleration measurement value, an amount of change in gravity, or a value that is obtained by measuring an amount of change in inertia. Thus, the controller 410 makes use of such information as the authentication information. In addition, the external device 170 may recognize that the position is changed, using an image of the user that is input through the camera and the like, and may measure a value that is changed.

On the other hand, if the authentication information is input in this manner, the controller 410 of the vehicle control apparatus 400 controls the driving of the vehicle using the authentication information that is input. For example, the controller 410 may recognize the current user according to the authentication information, and may cancel the locked state of the vehicle and set an internal environment of the vehicle that corresponds to the recognized user. In addition, if the locked state of the vehicle is canceled and the authentication information is input back in a state where the vehicle stops, the controller 410 may return the unlocked state of the vehicle to the locked state.

The vehicle may be controlled immediately using the authentication information on the user, which is input through the external device 170, but the controller 410 may request the user to go through an authentication process one more time. In this case, if the external device 170 is positioned within a given distance from the controller 410 or the authentication information is input through the external device 170, the controller 110 switches the state of the vehicle to a wake up state and prepares for starting the vehicle according to the authentication information that is input from the authenticated user. If in a state where the vehicle switches to the wake up state, the user inputs the authentication information one more time into a predetermined region (for example, the window in the driver seat or in the front passenger seat, the A- or B-, or C-pillar, or the like), the controller 110 authenticates the user according to the input and thus starts the vehicle.

In addition, the example is described above in which an authentication procedure is one more time is performed, but of course, more authentication procedures may be performed without limitation. In addition, the example is described above in which if the authentication information on the user is input through the external device 170, the multiple authentication procedures are performed, but of course, the multiple authentication procedure may be applied also to a case where the user inputs the authentication information on him/her directly into touch screen region that is formed on one portion of the vehicle.

Control Method for Proximity Sensor

Figure 15A:
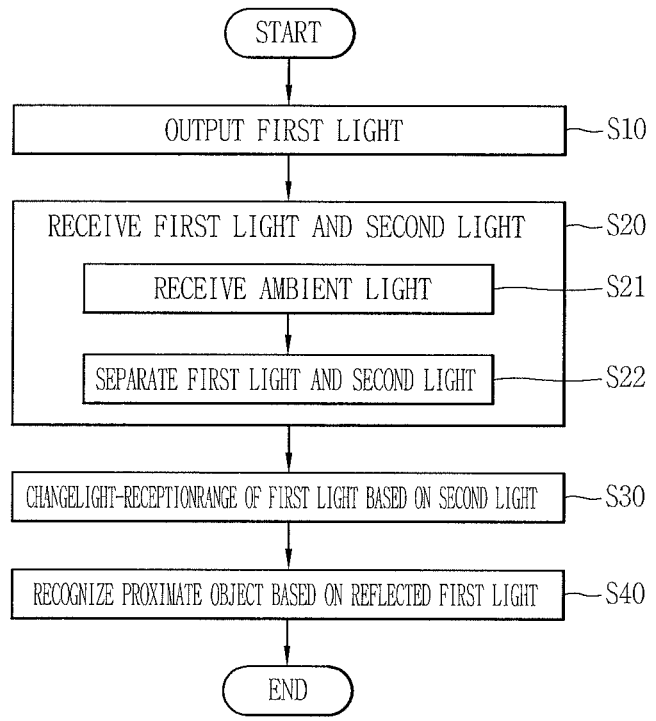
FIGS. 15A and 15B are flowcharts illustrating sequential steps of a control method for a proximity sensor in accordance with one exemplary embodiment disclosed herein.
Figure 15B:
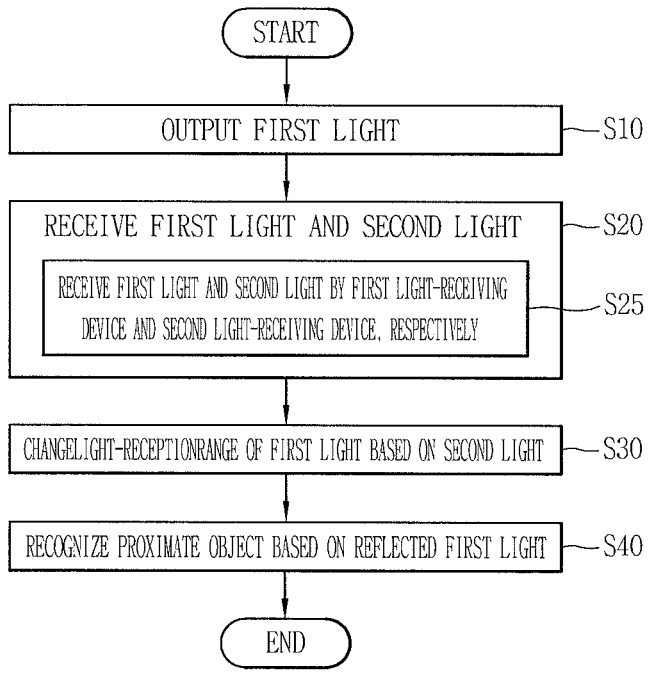

FIGS. 15A and 15B are flowcharts illustrating sequential steps of a control method for a proximity sensor in accordance with one exemplary embodiment disclosed herein.

A control method for a proximity sensor according to one exemplary embodiment disclosed herein includes emitting by a light-emitting part first light of a specific wavelength band (S10), receiving by a light-receiving part the first light and second light of a wavelength band different from that of the first light (S20), changing by a controller a light-reception range of the light-receiving part based on the second light (S30), and recognizing by the controller a proximate object based on the first light reflected by the proximate object (S40).

Hereinafter, each step will be explained with reference to FIGS. 2 to 12, but the same elements and steps as those in the foregoing description will not be described again in detail.

First, a light-emitting part 12 emits first light of a specific wavelength band (S10).

The light-emitting part 12 which outputs light in response to an electric signal emits the first light of the specific wavelength band, preferably, an infrared light wavelength band.

Afterwards, a light-receiving part 13 receives the first light and second light of a wavelength band different from that of the first light (S20).

The light-receiving part 13 which receives ambient light and converts the received light into an electric signal receives external light, emitted from various types of light sources, in addition to the first light output from the light-emitting part 12. Specifically, the ambient light may include external light which has wavelength bands different from that of the first light. Here, the external light may belong to a visible light wavelength range in which light has a wavelength shorter than that of the first light.

The step (S20) of receiving by the light-receiving part 13 the first light and the second light may include receiving by an ambient light receiving device 13a ambient light including the first light and the second light (S21), and separating by a filter 13b the first light and the second light from the ambient light according to a preset wavelength range (S22).

Also, the step (S20) of receiving by the light-receiving part 13 the first light and the second light may include, as illustrated in FIG. 15B according to another embodiment, receiving the first light by a first light-receiving device 13c and receiving the second light by a second light-receiving device 13d (S25).

That is, the light-receiving part 13 may include the plurality of light-receiving devices 13c and 13d, which receive the first light and the second light, respectively.

Afterwards, the controller 11 changes a light-reception range of the first light based on the second light (S30).

In general, since the light received by the light-receiving part 13 is limited to light having illumination belonging to a predetermined range, when the related art light-receiving part 13 has a wide light-reception range, the controller 11 is unable to recognize variation of the first light due to a proximate object reflecting the pulse type first light output from the light-emitting part 12.

To solve the problem, the controller 11 may change the light-reception range of the light-receiving part 13 based on illumination of the second light.

In detail, when an analog-digital converter 14 converts an analog optical signal of the first light into a digital signal, an illumination range of the analog optical signal to be converted into the digital signal may be changed according to the illumination of the second light, thereby improving resolution. This may result in an increase in a recognition rate for the proximate object.

That is, when the illumination of the second light is high, the illumination range of the first light that the analog-digital converter 14 converts may be reduced. On the other hand, when the illumination of the second light is low, the illumination range of the first light that the analog-digital converter 14 converts may increase.

Therefore, the controller 11 may change the light-reception range according to the illumination of the second light and recognize the first light reflected by the proximate object based on the changed light-reception range. Thus, the problem of the lowered recognition rate with respect to the object can be solved even if external light changes.

Afterwards, the controller 11 recognizes the proximate object based on the first light, which has been output from the light-emitting unit 12, reflected by the proximate object and then received in the light-receiving part 13 (S40).

For example, the controller 11 may calculate a distance between a proximity sensor 10 and the proximate object, which has reflected the first light, using a value obtained by integrating the reflected first light for a predetermined period of time.

In detail, the controller 11 may compare a value, which is obtained by integrating the reflected first light for the predetermined period of time, with a preset integration value, and apply the comparison result to a reference distance corresponding to the preset integration value, so as to calculate the distance from the proximity sensor 10 to the proximate object.

As another example, the controller 11 may compare the first light emitted from the light-emitting part 12 with the first light, which has been reflected by the proximate object and then received in the light-receiving part 13, thus recognizing the proximate object based on the comparison result.

In detail, the controller 11 may calculate the distance between the proximity sensor 10 and the proximate object which has reflected the first light, using an intensity difference, a potential difference and the like between the first light and the reflected first light.

Also, a plurality of proximity sensors 10 which are arranged in an array form may calculate a distance value up to the proximate object, respectively, such that coordinates of an installation area of one of the plurality of proximity sensors 10, on which the proximate object is located, can be calculated using the reflectively calculated distances.

FIG. 16 is a flowchart illustrating sequential steps of a control method for a proximity sensor in accordance with another exemplary embodiment disclosed herein.

As illustrated in FIG. 16, a control method for a proximity sensor may further include changing a quantity of the first light output by the light-emitting part and a light-emitting duration of the first light based on the second light (S35), between the step (S20) of receiving the first light and the second light and the step (S40) of recognizing the proximate object using the reflected first light.

An optical signal output by the light-emitting part 12 may be a pulse type signal which has a predetermined period with a predetermined pulse width.

When external light such as outdoor solar light has a high illumination value, as illustrated in (a) of FIG. 6B, the first light occupies a less part of the light received by the light-receiving part 13. Therefore, the proximity sensor suffers from recognizing the proximate object using variation of the reflected first light.

To solve the problem, the controller 11 may increase the quantity of the first light emitted by the light-emitting part 12 when the second light has a higher illumination value (see (a) of FIG. 7). Accordingly, even if external light has high illumination, the rate of the first light included in the quantity of light received in the light-receiving part 13 can be relatively increased (see (b) of FIG. 7). This may enable the proximity sensor to recognize the proximate object using the variation of the reflected first light.

Accordingly, since the quantity of light of the optical signal output by the light-emitting part 12 depends on illumination of external light received by the light-receiving part 13, the recognition rate with respect to the proximate object may be improved and of course, power consumption caused due to the output of the light-emitting part 12 can be reduced.

As aforementioned, the controller 11 according to the one embodiment disclosed herein may adjust the quantity of the first light emitted by the light-emitting part 12 and the light-emitting duration thereof according to the illumination of the second light. Here, the quantity of the first light output by the light-emitting part 12 and the light-emitting duration thereof may preferably be adjustable such that a value, which is obtained by integrating variation of illumination, caused due to the first light reflected by the proximate object, on the time basis, can be uniform.

Accordingly, the controller 11 may increase the quantity of the first light emitted by the light-emitting part 12 and/or the light-emitting duration of the first light when the second light has high illumination, or reduce the quantity of the first light emitted by the light-emitting part 12 and/or the light-emitting duration of the first light when the second light has low illumination.

In other words, the controller 11 may increase a value obtained by integrating the quantity of the first light emitted by the light-emitting part 12 according to the light-emitting duration when the second light has high illumination, or reduce the value obtained by integrating the quantity of the first light emitted by the light-emitting part 12 according to the light-emitting duration when the second light has low illumination.

In this manner, when the first light emitted by the light-emitting part 12 changes according to the illumination of the second light, the quantity of light and/or the light-emitting duration change. Thus, power consumption caused due to the output of the light-emitting part 12 can be reduced and also a user cannot visually recognize the light-emitting part 12, more particularly, a light-emitting diode even if the light-emitting diode of the light-emitting part 12 is externally exposed.

Meanwhile, the control method for the proximity sensor according to one exemplary embodiment may further include changing illumination of an external light source or a backlight unit (BLU) included in a display unit based on the second light (S50), after the step (S40) of recognizing the proximate object using the reflected first light.

The proximity sensor disclosed herein may be connected to the light source or the BLU of the display unit of the terminal.

Terminals such as a mobile terminal, a vehicle control apparatus and the like are provided with the proximity sensor according to the present disclosure. Illumination of the display unit on which information processed in the terminal is output changes based on the second light received in the proximity sensor.

In detail, the display unit included in the terminal may perform On/Off control of a light source, a control of a quantity of light output from the light source, a control of an output time of the light source, a control of output wavelength of the light source and the like. Here, the controller 11 may control illumination of the light source or the display unit.

According to one exemplary embodiment, when external light is outdoor solar light, the controller 11 controls the illumination of the display unit such that brightness of the display unit can be adjusted to be darker or brighter.

Therefore, when the proximity sensor 10 disclosed herein is installed at a position adjacent to the display unit of the terminal, brightness of the display unit may be adjustable according to illumination of external light. Consequently, the brightness of the display unit can be automatically adjusted adaptive to illumination around the display unit, without further employing an optical sensor for controlling the brightness of the display unit.

Computer-Readable Record Medium

Further, the control method for the proximity sensor according to one exemplary embodiment according to the present disclosure can be implemented as computer-readable codes which are executable by various computer components in a program-recorded medium. The computer-readable medium may include program instructions, data files, data structures and the like individually or by combination thereof. The program instructions recorded in the computer-readable media may be specifically designed and configured for the present disclosure or known to those skilled in computer software fields for use. Examples of possible machine-readable media include hardware devices, which are specifically constructed to store and execute program instructions, such as HDD (Hard Disk Drive), SSD (Solid State Disk), SDD (Silicon Disk Drive), ROM, RAM, CD-ROM, a magnetic tape, a floppy disk, an optical data storage device, the other types of storage mediums presented herein, and combinations thereof. Examples of the program instructions may include machine language codes which are made by a compiler, and high-level language codes which are executable by a computer using an interpreter or the like. The hardware device may be configured to operate as one or more software modules for executing a processing operation according to the present disclosure, or vise versa.

As the present features may be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds are therefore intended to be embraced by the appended claims.

What is claimed is:

1. A proximity sensor comprising:
a light-emitting part that is configured to emit a first light of a first wavelength band;
a light-receiving part that is configured to receive the first light of the first wavelength band emitted by the light-emitting part and a second light of a second wavelength band different from the first wavelength band, the second light emitted by a light source other than the light-emitting part; and
a controller that is configured to recognize a proximate object based on at least a portion of the first light of the first wavelength band that is reflected by the proximate object and received by the light-receiving part,
wherein the controller is configured to change a light-reception range of the light-receiving part based on an amount of illumination received from the second light of the second wavelength band, and
wherein the controller is configured to change, based on an amount of illumination received from the second light of the second wavelength band, a quantity and a light-emitting duration of the first light of the first wavelength band emitted by the light-emitting part based on comparing a predetermined value with an integral of time variations of received illumination comprising at least a portion of the first light of the first wavelength band that has been reflected and received by the light-receiving part.

2. The proximity sensor of claim 1, wherein the light-receiving part comprises:
an ambient light receiving device that is configured to receive ambient light; and
a filter that is configured to filter the first light of the first wavelength band and the second light of the second wavelength band from the ambient light.

3. The proximity sensor of claim 1, wherein the light-receiving part comprises:
a first light-receiving device that is configured to receive the first light of the first wavelength band emitted from the light-emitting part; and
a second light-receiving device that is configured to receive the second light of the second wavelength band.

4. The proximity sensor of claim 1, wherein the first wavelength band is in an infrared light wavelength band, and the second wavelength band is in a visible light wavelength band.

5. The proximity sensor of claim 1, wherein the light-emitting part is configured to emit the first light of the first wavelength band in a periodic manner.

6. The proximity sensor of claim 1, further comprising:
an analog-to-digital converter that is configured to convert an analog optical signal of the first light of the first wavelength band that is received by the light-receiving part into a digital optical signal.

7. The proximity sensor of claim 6, wherein the controller is configured to change, based on an amount of illumination from the second light of the second wavelength band received by the light-receiving part, an illumination range of the first light of the first wavelength band that is received by the light-receiving part and converted by the analog-to-digital converter.

8. The proximity sensor of claim 7, wherein the controller is configured to:
increase the illumination range of the first light of the first wavelength band received by the light-receiving part and converted by the analog-to-digital converter as a result of a larger amount of illumination from the second light of the second wavelength band received by the light-receiving part, and
decrease the illumination range of the first light of the first wavelength band received by the light-receiving part and converted by the analog-to-digital converter as a result of a smaller amount of illumination from the second light of the second wavelength band received by the light-receiving part.

9. The proximity sensor of claim 1, wherein the controller is configured to:
obtain a value by integrating, over the light-emitting duration, the quantity of the first light of the first wavelength band that is emitted by the light-emitting part;
control the output of the light-emitting part such that the value increases as a result of a larger amount of illumination from the second light of the second wavelength band received by the light-receiving part, and
control the output of the light-emitting part such that the value decreases as a result of a smaller amount of illumination from the second light of the second wavelength band received by the light-receiving part.

10. A mobile terminal comprising:
the proximity sensor according to claim 1; and
a display unit that is configured to display information processed in the mobile terminal,
wherein the display unit is configured to vary a display illumination based on the amount of illumination received from the second light of the second wavelength band.

11. A vehicle control apparatus comprising:
the proximity sensor according to claim 1; and
a display unit that is configured to display information processed in the vehicle control apparatus,
wherein the display unit is configured to vary a display illumination based on the amount of illumination received from the second light of the second wavelength band.

12. A method of controlling a proximity sensor, the method comprising:
emitting, by a light-emitting part, a first light of a first wavelength band;
receiving the emitted first light of the first wavelength band and a second light of a second wavelength band different than the first wavelength band, the second light emitted by a light source other than the light-emitting part;
changing a light-reception range of the first light of the first wavelength band based on an amount of illumination received from the second light of the second wavelength band;
recognizing a proximate object based on at least a portion of the first light of the first wavelength band that is reflected by the proximate object and received; and
changing, based on the amount of received illumination from the second light of the second wavelength band, a quantity and a light-emitting duration of the emitted first light of the first wavelength band based on comparing a predetermined value with an integral of time variations of received illumination comprising at least a portion of the first light of the first wavelength band that has been reflected and received.

13. The method of claim 12, wherein receiving the first light of the first wavelength band and the second light of the second wavelength band comprises:

receiving the first light of the first wavelength band by a first light-receiving device, and receiving the second light of the second wavelength band by a second light-receiving device.

14. The method of claim 12, wherein receiving the first light of the first wavelength band and the second light of the second wavelength band comprises:

receiving ambient light including the first wavelength band and the second wavelength band; and filtering the first light of the first wavelength band and the second light of the second wavelength band from the ambient light.

15. The method of claim 12, wherein changing the light-reception range comprises changing an illumination range of the first light of the first wavelength band based on a received illumination of the second light of the second wavelength band as a result of an analog signal of the received first light of the first wavelength band being converted into a digital signal.

* * * * *